United States Patent
Kurita

(10) Patent No.: US 9,281,197 B2
(45) Date of Patent: Mar. 8, 2016

(54) EPITAXIAL SUBSTRATE FOR SOLID-STATE IMAGING DEVICE WITH GETTERING SINK, SEMICONDUCTOR DEVICE, BACK ILLUMINATED SOLID-STATE IMAGING DEVICE AND MANUFACTURING METHOD THEREOF

(75) Inventor: Kazunari Kurita, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 168 days.

(21) Appl. No.: 13/124,578

(22) PCT Filed: Oct. 16, 2009

(86) PCT No.: PCT/JP2009/005428
§ 371 (c)(1),
(2), (4) Date: Jun. 21, 2011

(87) PCT Pub. No.: WO2010/044279
PCT Pub. Date: Apr. 22, 2010

(65) Prior Publication Data
US 2011/0248372 A1 Oct. 13, 2011

(30) Foreign Application Priority Data

Oct. 16, 2008 (JP) .............................. P2008-267341
Oct. 16, 2008 (JP) .............................. P2008-267342
Oct. 16, 2008 (JP) .............................. P2008-267343
Mar. 23, 2009 (JP) .............................. P2009-069601

(51) Int. Cl.
*H01L 31/02* (2006.01)
*H01L 21/268* (2006.01)
(Continued)

(52) U.S. Cl.
CPC ............ *H01L 21/268* (2013.01); *H01L 21/322* (2013.01); *H01L 27/14603* (2013.01); *H01L 27/14698* (2013.01); *C30B 29/06* (2013.01); *Y10S 117/904* (2013.01)

(58) Field of Classification Search
CPC . H01L 21/3225; H01L 21/268; H01L 21/322; H01L 27/14603; H01L 27/14698
USPC .............................................. 117/2; 257/443
See application file for complete search history.

(56) References Cited

U.S. PATENT DOCUMENTS 4,668,304 A * 5/1987 Schachameyer et al. ..... 438/473
4,782,029 A 11/1988 Takemura et al.
(Continued)

FOREIGN PATENT DOCUMENTS

JP 58-44726 3/1983
JP 06-338507 12/1994
(Continued)

OTHER PUBLICATIONS

Taiwan Office action, dated Sep. 28, 2012 along with an english translation thereof.
(Continued)

*Primary Examiner* — Michael Kornakov
*Assistant Examiner* — Hua Qi
(74) *Attorney, Agent, or Firm* — Greenblum & Bernstein, P.L.C.

(57) ABSTRACT

A semiconductor wafer is set in a laser irradiation apparatus, and laser beam irradiation is performed while the semiconductor wafer is moved. At this time, a laser beam emitted from a laser generating apparatus is condensed by a condensing lens so that the condensing point (focal point) is positioned at a depth of several tens of $\mu m$ or so from one surface of the semiconductor wafer. Thereby, the crystal structure of the semiconductor wafer in the position having such a depth is modified, and a gettering sink is formed.

12 Claims, 19 Drawing Sheets

(51) Int. Cl.
    *H01L 21/322*     (2006.01)
    *H01L 27/146*     (2006.01)
    *C30B 29/06*     (2006.01)

(56) References Cited

U.S. PATENT DOCUMENTS

| | | | | |
|---|---|---|---|---|
| 5,567,632 | A | * | 10/1996 | Nakashiba et al. ............ 438/78 |
| 7,211,141 | B2 | | 5/2007 | Kobayashi |
| 8,309,436 | B2 | * | 11/2012 | Kurita ............................ 438/471 |
| 8,357,592 | B2 | * | 1/2013 | Kurita ............................ 438/473 |
| 2002/0127766 | A1 | * | 9/2002 | Ries et al. ........................ 438/94 |
| 2004/0224483 | A1 | * | 11/2004 | Takyu et al. .................. 438/462 |
| 2005/0170572 | A1 | * | 8/2005 | Hongo et al. .................. 438/166 |
| 2005/0239267 | A1 | * | 10/2005 | Tobashi ........................ 438/455 |
| 2006/0006488 | A1 | | 1/2006 | Kanbe |
| 2006/0011593 | A1 | * | 1/2006 | Fukuyo et al. ........... 219/121.67 |
| 2006/0054088 | A1 | | 3/2006 | Jagawa et al. |
| 2006/0150894 | A1 | * | 7/2006 | Kobayashi ...................... 117/84 |
| 2008/0020496 | A1 | * | 1/2008 | Yamashita et al. .............. 438/14 |
| 2008/0020545 | A1 | * | 1/2008 | Atanackovic ................. 438/455 |
| 2008/0057324 | A1 | * | 3/2008 | Nakahara et al. ............. 428/446 |
| 2008/0096368 | A1 | * | 4/2008 | Sakai ............................ 438/473 |
| 2008/0283726 | A1 | | 11/2008 | Uya |
| 2009/0321883 | A1 | | 12/2009 | Kurita |
| 2010/0304552 | A1 | | 12/2010 | Kurita |
| 2010/0311199 | A1 | | 12/2010 | Kurita |
| 2011/0089524 | A1 | | 4/2011 | Nonogaki |

FOREIGN PATENT DOCUMENTS

| | | | | |
|---|---|---|---|---|
| JP | 2000-211997 | | 8/2000 | |
| JP | 2002-222780 | | 8/2002 | |
| JP | 2003-264194 | | 9/2003 | |
| JP | 2003264194 A | * | 9/2003 | ............ H01L 21/322 |
| JP | 2005-064254 | | 3/2005 | |
| JP | 2006-19360 | | 1/2006 | |
| JP | 2006-93175 | | 4/2006 | |
| JP | 2006-313922 | | 11/2006 | |
| JP | 2008-027974 | | 2/2008 | |
| JP | 2008-103664 | | 5/2008 | |
| JP | 2008-108792 | | 5/2008 | |
| JP | 2009-16431 | | 1/2009 | |
| KR | 10-0133950 B1 | | 4/1998 | |
| KR | 10-2004-0103222 A | | 12/2004 | |
| KR | 20040103222 A | * | 12/2004 | ............ H01L 21/322 |
| KR | 10-2006-0040733 A | | 5/2006 | |

OTHER PUBLICATIONS

Sano et al., "Semiconductor Silicon", The Electrochemical Society, 1994, pp. 784-795.

Korea Office action, dated Mar. 27, 2013 along with an english translation thereof.

Japan Office action, dated Sep. 10, 2013 along with an english translation thereof.

* cited by examiner (a)

(b)

(c)

(d)

EPITAXIAL SUBSTRATE FOR SOLID-STATE IMAGING DEVICE WITH GETTERING SINK, SEMICONDUCTOR DEVICE, BACK ILLUMINATED SOLID-STATE IMAGING DEVICE AND MANUFACTURING METHOD THEREOF

TECHNICAL FIELD

The present invention relates to an epitaxial substrate for a solid-state imaging device, a semiconductor device, a back illuminated solid-state imaging device and a method of manufacturing the same, and relates to a technique capable of easily forming a gettering sink in a short time.

This application claims the benefits of Japanese Patent Application Nos. 2008-267341, 2008-267342 and 2008-267343, filed in the Japanese Patent Office on Oct. 16, 2008, and Japanese Patent Application No. 2009-069601, filed in the Japanese Patent Office on Mar. 23, 2009, the content of which is incorporated herein by reference.

BACKGROUND ART

In recent years, high-performance solid-state imaging devices using semiconductors have been mounted in cellular phones, digital video cameras and the like, and the number of pixels and performance such as sensitivity has been dramatically improved. The solid-state imaging devices are manufactured by forming a circuit constituted by photodiodes and the like in an epitaxial layer, for example, using an epitaxial substrate in which the epitaxial layer is grown on one surface of the semiconductor substrate.

In recent years, as miniaturization and increasing resolution of the solid-state imaging device have progressed, the layout density of the photodiodes has considerably increased. For this reason, since the sizes of the individual photodiodes become extremely small, the amount of light capable of being incident to each of the photodiodes decreases. In order to avoid a decrease in the amount of incident light due to progression of miniaturization and increasing resolution of the solid-state imaging device, back illuminated solid-state imaging devices having a structure in which light is incident from the back side thereof with a small number of constituent parts such as a circuit layer are also generally known.

However, a dark leakage current of the photodiode is a problematic factor which causes deterioration in the imaging characteristics of the solid-state imaging device. It is considered that the dark leakage current is caused by heavy-metal contamination of a substrate (wafer) during the manufacturing process.

Hitherto, in order to suppress heavy-metal contamination of the substrate, operations have been performed for reducing the concentration of heavy metals in the photodiode forming portion by forming a gettering sink for heavy metals in the inside or the back surface of the semiconductor wafer and collecting heavy metals in the gettering sink.

In addition, recently, as cellular phones, digital video cameras and the like have considerably thinned, the thinning of a semiconductor device, for example, a semiconductor memory built into these apparatuses has progressed. The semiconductor memory is manufactured by forming a device on one surface of a silicon substrate (silicon wafer) made of, for example, a silicon single crystal. In order to make the semiconductor memory thin, the device is formed on the surface side of the silicon substrate, and then the device is thinned to a thickness of, for example, 50 µm or so, by cutting the back side of the silicon substrate.

In such a step of thinning a semiconductor device, there is a growing concern about mixing of heavy metals into the silicon substrate. When impurities such as heavy metals are mixed into the silicon substrate, the device characteristics are remarkably deteriorated due to the leakage current and the like. For this reason, it is important to suppress dispersion of heavy metals in a device forming region after the step of thinning the silicon substrate.

Hitherto, as a method of removing heavy metals from the silicon substrate, a gettering method is generally known. This is to reduce heavy metals in the element forming region, by forming a region for capturing heavy metals, referred to as a gettering site, in the silicon substrate and collecting heavy metals in the gettering site using an annealing treatment and the like. As a method of forming the gettering site in the silicon substrate, for example, an IG (intrinsic gettering) method of forming oxygen precipitates in the silicon substrate (for example, PTL 1), and an EG (extrinsic gettering) method of forming the gettering site such as back side damage in the back side of the silicon substrate (for example, PTL 2) are known.

PATENT LITERATURE

[PTL 1] Japanese Unexamined Patent Application Publication No. H6-338507
[PTL 2] Japanese Unexamined Patent Application Publication No. 2006-313922

A method is known of forming an oxygen precipitation portion in the inside of the semiconductor substrate by performing heat treatment on the substrate, and uses the oxygen precipitation portion as a gettering sink (for example, NPL 1).

[NPL 1] M. Sano, S. Sumita, T. Shigematsu and N. Fujino, Semiconductor Silicon 1994. eds. H. R. Huff et al. (Electrochem. Soc., Pennington 1994)

SUMMARY OF INVENTION

Technical Problem

However, in the method of forming the oxygen precipitation portion in the inside of the semiconductor substrate by performing a heat treatment on the substrate, in order to form the oxygen precipitation portion having a size capable of sufficiently capturing heavy metals, there is a problem that heat treatment for a long period of time is required, and the manufacturing process is prolonged, which leads to an increase in the manufacturing cost. In addition, in the heat treatment step, there may also be a concern that further heavy-metal contamination occurs due to a heating apparatus and the like.

The IG method is a method used in a previous step of forming the device in the silicon substrate, and needs a heat treatment temperature of 600° C. or higher in order to remove heavy metals diffused in the silicon substrate. However, the temperature of heat treatment performed after the device is formed in the silicon substrate does not exceed 400° C., and thus there is a problem that heavy metals mixed in the thinning step after the device is formed cannot be sufficiently captured.

In addition, as the recent thinning of semiconductor devices has progressed, the semiconductor device has been required to have a thickness of 50 to 40 µm or less, and further 30 µm or so. With the thickness having such a level, since the great majority of the gettering sink formed in the silicon substrate is scraped away in the thinning step, sufficient gettering capability is not obtained.

In the EG method of forming the gettering site such as back side damage in the back side of the silicon substrate, in the case of a large-diameter substrate such as a wafer having a diameter of 300 mm which has recently become mainstream, it is difficult, in itself, to form the gettering sink in the back side thereof since both sides of the substrate are polished.

One aspect of the invention is contrived to solve the foregoing problems, and is to provide a method of manufacturing an epitaxial substrate for a solid-state imaging device which is capable of easily forming a gettering sink in a short time, and avoiding heavy-metal contamination at the time of forming the gettering sink.

In addition, one aspect of the invention is to provide an epitaxial substrate for a solid-state imaging device which has little heavy-metal contamination and is capable of being manufactured at low cost.

In addition, one aspect of the invention is to provide a method of manufacturing a semiconductor device which is capable of simply and reliably removing heavy metals contaminated after the formation of the semiconductor device from a device forming region.

In addition, one aspect of the invention is to provide a semiconductor device having no deterioration in characteristics due to heavy metals even when thinned.

Solution to Problem

A method of manufacturing an epitaxial substrate for a solid-state imaging device according to one aspect of the invention includes the steps of: growing an epitaxial layer on one surface of a semiconductor substrate to form an epitaxial substrate; forming a gettering sink in which a crystal structure of an arbitrary microscopic region of the semiconductor substrate is changed, by causing a laser beam to be incident on the epitaxial substrate through a condensing means and condensing the laser beam in the microscopic region, to cause a multi-photon absorption process to occur in the microscopic region; and annealing the epitaxial substrate at a predetermined temperature to capture heavy metals in the gettering sink.

It is preferable that the laser beam has a wavelength band capable of being transmitted through the epitaxial substrate, and that the condensing means condenses the laser beam to an arbitrary position in the thickness direction of the semiconductor substrate. It is preferable that the laser beam is an ultra-short pulsed-laser beam having a pulse width in a range of $1.0 \times 10^{-15}$ to $1.0 \times 10^{-8}$ seconds and a wavelength in a range of 300 to 1,200 nm.

It is preferable that the semiconductor substrate is made of a single crystal silicon, and that the gettering sink includes silicon having an amorphous structure. It is preferable that the gettering sink is formed at a position that overlaps a region for forming the solid-state imaging device.

An epitaxial substrate for a solid-state imaging device of the invention is manufactured by the above-mentioned method of manufacturing an epitaxial substrate for a solid-state imaging device, wherein the gettering sink is provided to a region that overlaps at least a position for forming a buried-type photodiode included in the solid-state imaging device, with a size in a range of a diameter of 50 to 150 µm and a thickness of 10 to 150 µm.

It is preferable that the gettering sink is formed in a range of a density of $1.0 \times 10^5$ to $1.0 \times 10^7$ counts/cm².

According to the method of manufacturing the epitaxial substrate for a solid-state imaging device of the invention, it is possible to form, easily and in a short time, the gettering sink in which only the crystal structure of an arbitrary microscopic region inside the semiconductor substrate is changed, by causing the laser beam to be incident on the epitaxial substrate through the condensing means and condensing the laser beam in the microscopic region, to cause the multi-photon absorption process to occur in the microscopic region inside the semiconductor substrate.

Thereby, heat treatment for a long period of time is not required for forming the gettering sink as in the related art, and thus it is possible to simplify the step of manufacturing the epitaxial substrate for a solid-state imaging device, and to reduce the manufacturing costs. It is possible to easily form the gettering sink in the inside of the semiconductor substrate even with respect to the substrate polished on both sides represented by a wafer having a diameter of 300 mm and the like.

According to the epitaxial substrate for a solid-state imaging device of the invention, it is possible to provide an epitaxial substrate for a solid-state imaging device which is capable of realizing a solid-state imaging device having an excellent capability of gettering heavy metals, a small amount of a dark leakage current, and excellent imaging characteristics.

[Semiconductor Device]

A method of manufacturing a semiconductor device according to the invention includes at least the steps of: forming an insulating film on one surface of the semiconductor substrate; forming a gettering sink in which a crystal structure of an arbitrary microscopic region of the semiconductor substrate is changed, by causing a laser beam to be incident from the other surface of the semiconductor substrate through a condensing means and condensing the laser beam in the microscopic region, to cause a multi-photon absorption process to occur in the microscopic region; and annealing the semiconductor substrate at a predetermined temperature to capture heavy metals in the gettering sink.

It is preferable that the laser beam has a wavelength band capable of being transmitted through the semiconductor substrate, and that the condensing means condenses the laser beam to an arbitrary position in the thickness direction of the semiconductor substrate. It is preferable that the laser beam is an ultra-short pulsed-laser beam having a pulse width in a range of $1.0 \times 10^{-15}$ to $1.0 \times 10^{-8}$ seconds and a wavelength in a range of 300 to 1,200 nm.

It is preferable that the semiconductor substrate is made of a single crystal silicon, and that the gettering sink includes silicon having an amorphous structure in at least a portion thereof. It is preferable that the gettering sink is formed at a position that overlaps at least a region for forming the device.

A semiconductor device according to the invention is manufactured by the above-mentioned method of manufacturing a semiconductor device. It is preferable that the gettering sink is formed in a range of a density of $1.0 \times 10^5$ to $1.0 \times 10^6$ counts/cm².

According to the method of manufacturing the semiconductor device of the invention, it is possible to form, easily and in a short time, the gettering sink in which only the crystal structure of an arbitrary microscopic region inside the semiconductor substrate is changed, by causing the laser beam to be incident on the semiconductor substrate through the condensing means and condensing the laser beam in the microscopic region, to cause the multi-photon absorption process to occur in the microscopic region inside the semiconductor substrate.

Thereby, heat treatment for a long period of time is not required for forming the gettering sink as in the related art, and the process of manufacturing the semiconductor device is simplified, thereby allowing the manufacturing costs to be reduced. It is possible to easily form the gettering sink in the inside of the semiconductor substrate even with respect to the substrate polished on both sides represented by a wafer having a diameter of 300 mm and the like.

According to the semiconductor device of the invention, it is possible to provide a semiconductor device which has an excellent capability of gettering heavy metals even when thinned, a small amount of a leakage current and excellent characteristics.

[Back Illuminated Solid-State Imaging Device]

A method of manufacturing a back illuminated solid-state imaging device according to the invention includes at least the steps of: growing an epitaxial layer on one surface of a semiconductor substrate to form an epitaxial substrate; forming a gettering sink in which a crystal structure of an arbitrary microscopic region of the semiconductor substrate is changed, by causing a laser beam to be incident on the epitaxial substrate through a condensing means and condensing the laser beam in the microscopic region, to cause a multi-photon absorption process to occur in the microscopic region; forming a plurality of photodiodes in the epitaxial substrate; annealing the epitaxial substrate at a predetermined temperature to capture heavy metals in the gettering sink; and removing a region including the gettering sink by reducing the thickness of the semiconductor substrate.

It is preferable that the laser beam has a wavelength band capable of being transmitted through the epitaxial substrate, and that the condensing means condenses the laser beam to an arbitrary position in the thickness direction of the semiconductor substrate. It is preferable that the laser beam is an ultra-short pulsed-laser beam having a pulse width in a range of $1.0 \times 10^{-15}$ to $1.0 \times 10^{-8}$ seconds and a wavelength in a range of 300 to 1,200 nm.

It is preferable that the semiconductor substrate is made of a single crystal silicon, and that the gettering sink includes silicon having an amorphous structure. It is preferable that the gettering sink is formed at a position that overlaps at least a region for forming the photodiode. It is preferable that a buried oxide film having a SOI structure is further formed between the gettering sink and the epitaxial layer.

An epitaxial substrate for a solid-state imaging device according to the invention includes a semiconductor substrate; an epitaxial layer formed on one surface of the semiconductor substrate; a gettering sink formed by changing a crystal structure of an arbitrary microscopic region of the semiconductor substrate, by causing a laser beam to be incident on the semiconductor substrate through a condensing means and condensing the laser beam in the microscopic region, to cause a multi-photon absorption process to occur in the microscopic region; and a buried oxide film having a SOI structure formed between the gettering sink and the epitaxial layer.

It is preferable that the gettering sink is provided to a region that overlaps at least a position for forming the photodiode, with a size in a range of a diameter of 50 to 150 μm and a thickness of 10 to 150 μm. It is preferable that the gettering sink is formed in a range of a density of $1.0 \times 10^5$ to $1.0 \times 10^7$ counts/cm².

According to the method of manufacturing the back illuminated solid-state imaging device of the invention, it is possible to form, easily and in a short time, the gettering sink in which only the crystal structure of an arbitrary microscopic region inside the semiconductor substrate is changed, by causing the laser beam to be incident on the epitaxial substrate through the condensing means and condensing the laser beam in the microscopic region, to cause the multi-photon absorption process to occur in the microscopic region inside the semiconductor substrate.

Thereby, since heavy metals included in the epitaxial layer are reliably captured by the gettering sink, it is possible to suppress a dark leakage current of the photodiode which is the cause of a decrease in the imaging characteristics of the back illuminated solid-state imaging device. Consequently, it is possible to realize the back illuminated solid-state imaging device having excellent imaging characteristics.

According to the epitaxial substrate for a solid-state imaging device of the invention, it is possible to provide an epitaxial substrate for a solid-state imaging device which is capable of realizing a back illuminated solid-state imaging device having an excellent capability of gettering heavy metals, a small amount of a dark leakage current, and excellent imaging characteristics.

[Silicon Wafer]

A method of manufacturing a silicon wafer according to one aspect of the invention includes at least: a slicing step of slicing a silicon single crystal ingot to obtain a silicon wafer; a multi-photon absorbing step of forming a gettering sink in which a crystal structure of an arbitrary microscopic region is changed, by causing a laser beam to be incident on the silicon wafer through a condensing means and condensing the laser beam in the microscopic region, to cause a multi-photon absorption process to occur in the microscopic region; and a polishing step of mirror-polishing the silicon wafer through the multi-photon absorbing step.

A lapping step of lapping the silicon wafer may be further included between the slicing step and the multi-photon absorbing step. An etching step of etching the silicon wafer may be further included between the slicing step and the multi-photon absorbing step.

It is preferable that the laser beam has a wavelength band capable of being transmitted through the silicon wafer, and that the condensing means condenses the laser beam to an arbitrary position in the thickness direction of the silicon wafer. It is preferable that the laser beam is an ultra-short pulsed-laser beam having a pulse width in a range of $1.0 \times 10^{--15}$ to $1.0 \times 10^{-8}$ seconds and a wavelength in a range of 300 to 1,200 nm. It is preferable that the gettering sink includes silicon having an amorphous structure.

A method of manufacturing an epitaxial wafer according to the invention includes at least an epitaxial step of growing an epitaxial layer made of a silicon single crystal on one surface of the silicon wafer obtained by the above-mentioned method of manufacturing a silicon wafer.

A method of manufacturing a solid-state imaging device according to the invention includes at least an element forming step of forming a buried-type photodiode on one surface of the epitaxial wafer obtained by the above-mentioned method of manufacturing an epitaxial wafer.

It is preferable to further include an annealing step of annealing the epitaxial wafer at a predetermined temperature to capture heavy metals in the gettering sink. The gettering sink may be formed at a region that overlaps at least a position for forming the buried-type photodiode, with a size in a range of a diameter of 50 to 150 μm and a thickness of 10 to 150 μm. The gettering sink may be formed so as to have a density in a range of $1.0 \times 10^5$ to $1.0 \times 10^7$ counts/cm².

Advantageous Effects of Invention

According to the method of manufacturing the silicon wafer according to the invention, laser light irradiation is performed to form the gettering sink in the multi-photon absorbing step, and then the silicon wafer is mirror-polished (polishing step), thereby allowing the minute flaws (ablation) on the surface of the silicon wafer caused by laser light irradiation to be completely removed. Thereby, it is possible to obtain the silicon wafer which has no minute flaws caused by laser irradiation on the surface thereof, and includes therein the gettering sink formed through the multi-photon absorbing step.

In addition, according to the method of manufacturing an epitaxial wafer of the invention, it is possible to obtain an epitaxial wafer having an excellent capability of gettering heavy metals.

Further, according to the method of manufacturing a solid-state imaging device of the invention, it is possible to realize a solid-state imaging device having a small amount of a dark leakage current and excellent imaging characteristics.

In addition, according to the method of manufacturing a solid-state imaging device of the invention, it is possible to realize a solid-state imaging device having an excellent capability of gettering heavy metals, a small amount of a dark leakage current, and excellent imaging characteristics.

DESCRIPTION OF EMBODIMENTS

Figure 1:
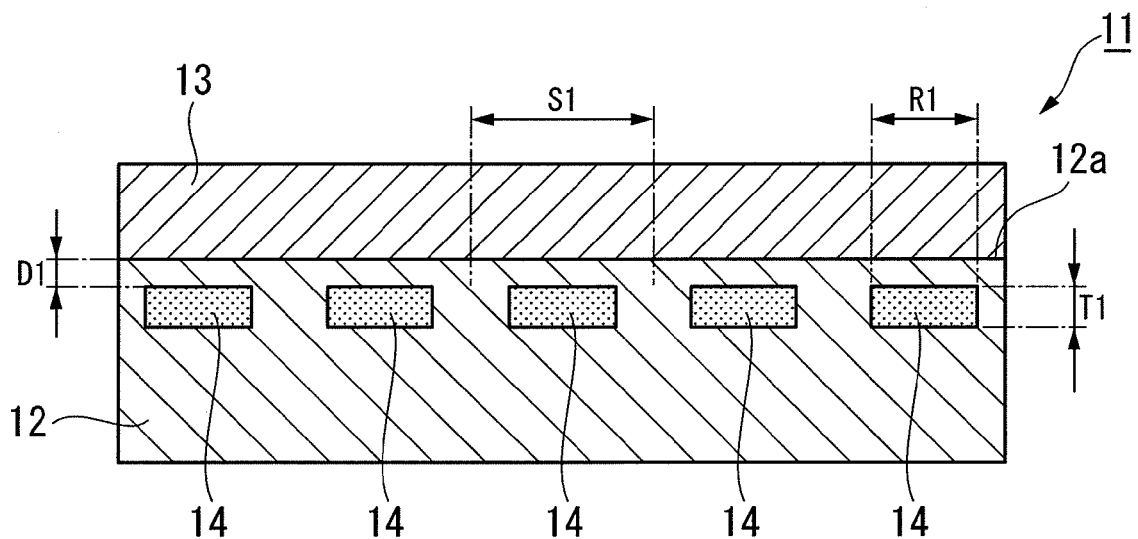
FIG. 1 is an enlarged cross-sectional view illustrating an embodiment of an epitaxial substrate for a solid-state imaging device according to the invention.

Hereinafter, various embodiments of the invention will be described with reference to the drawings. The following embodiments are ones which are specifically described in order to better understand the gist of the invention, and the invention is not limited thereto, except as otherwise noted. In the drawings used in the following description, the portions which are chief parts may be enlarged, for convenience, in order to easily understand the features of the invention; the dimension ratios and the like for each of the components are not limited to the same dimensions as real ones.

[Epitaxial Substrate for a Solid-State Imaging Device]

FIG. 1 is an enlarged cross-sectional view illustrating an epitaxial substrate for a solid-state imaging device according to an embodiment of the invention. An epitaxial substrate (epitaxial substrate for a solid-state imaging device) 11 includes a semiconductor substrate 12 and an epitaxial layer 13 formed on one surface 12a of the semiconductor substrate 12. Gettering sinks 14, 14 . . . for capturing heavy metals of the epitaxial substrate 11 are formed in the vicinity of one surface 12a of the semiconductor substrate 12.

Such an epitaxial substrate 11 can be suitably used as a substrate for a solid-state imaging device. The semiconductor substrate 12 may be, for example, a silicon single crystal wafer. The epitaxial layer 13 may be an epitaxial growth film of silicon grown from one surface 12a of the semiconductor substrate 12.

The gettering sink 14 may have an amorphous-like structure in which a portion of a silicon single crystal is made amorphous. The gettering sink 14 has a capability to capture heavy metals just by the existence of a little distortion in the crystal structure thereof, and can play a role as a gettering sink just by making amorphous only a small fraction thereof. A gettering sink in the related art is formed by a heat treatment of an entire semiconductor substrate. However, in the invention, the gettering sink 14 is formed by causing a multi-photon absorption process to occur in a portion of the semiconductor substrate 12 to thereby modify a crystal structure, by condensation of a laser beam. Such a method of forming the gettering sink 14 will be described later in detail in a method of manufacturing an epitaxial substrate for a solid-state imaging device.

When the solid-state imaging device is formed using the epitaxial substrate 11, the gettering sinks 14 may be formed at positions that overlap at least each of the solid-state imaging device forming regions S1. For example, one gettering sink 14 may be formed in the shape of a disk having a diameter R1 of 50 to 150 μm, more preferably 75 to 125 μm, and a thickness T1 of 10 to 150 μm, more preferably 10 to 100 μm. The depth D1 at which the gettering sink 14 is formed is preferably 0.5 to 2 μm or so from one surface 12a of the semiconductor substrate 12. D1 is more preferably 0.8 to 1.5 μm.

Figure 2:
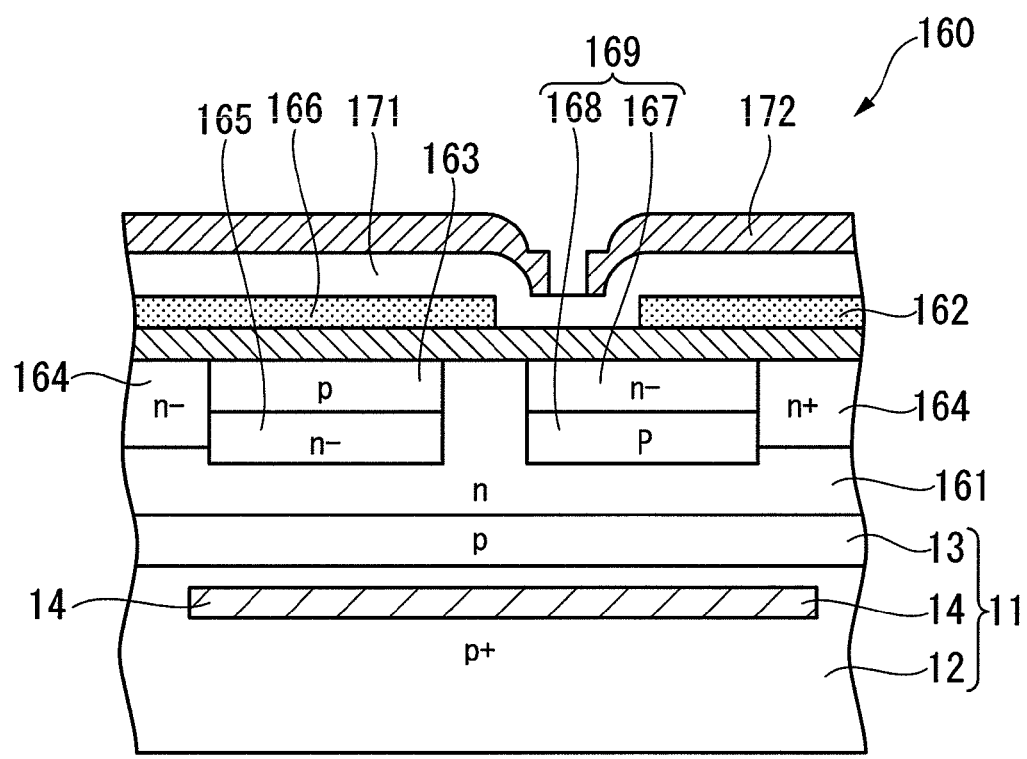
FIG. 2 is an enlarged cross-sectional view illustrating an example of a solid-state imaging device to which the embodiment is applied.

FIG. 2 is a cross-sectional view illustrating an example of the solid-state imaging device created using the epitaxial substrate for a solid-state imaging device according to the invention. In a solid-state imaging device 160, the epitaxial substrate 11 is used in which the p-type epitaxial layer 13 is formed on the p⁺-type semiconductor substrate (silicon substrate) 12, and the gettering sink 14 is further formed in the semiconductor substrate 12. A first n-type well region 161 is formed at a predetermined position of the epitaxial layer 13. A p-type transfer channel region 163, an n⁺-type channel stop region 164 and a second n⁻-type well region 165 included in a vertical transfer register are respectively formed in the inside of the first n-type well region 161.

A transfer electrode 166 is formed at a predetermined position of a gate insulating film 162. A photodiode 169 in which an n⁻-type positive charge accumulation region 167 and a p-type impurity diffusion region 168 are laminated is formed between the p-type transfer channel region 163, the second n-type well region 165 and n⁻-type channel stop region 164. The solid-state imaging device includes an interlayer insulating film 171 that covers the gate insulating film 162 and the photodiode 169, and a light shielding film 172 that covers the surface except for the upper portion directly located on the photodiode 169.

In the solid-state imaging device 160 having such a configuration, since heavy metals included in the epitaxial substrate 11 are reliably captured by the gettering sink 14 formed in the semiconductor substrate 12, it is possible to suppress a dark leakage current of the photodiode 169 which is the cause of a decrease in the imaging characteristics of the solid-state imaging device 160. Consequently, it is possible to realize the solid-state imaging device 160 having a small amount of a dark leakage current and excellent imaging characteristics, by forming the solid-state imaging device 160 using the epitaxial substrate 11 of the invention.

Figure 3:
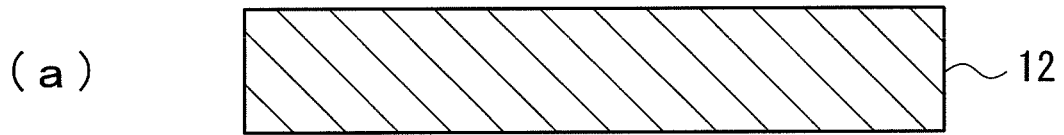
FIG. 3 is an enlarged cross-sectional view for explaining an embodiment of a method of manufacturing the epitaxial substrate for a solid-state imaging device according to the invention.
Figure 3:
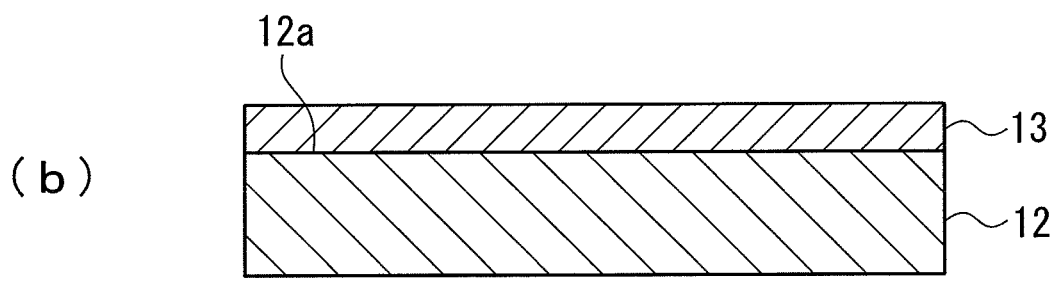
Figure 3:
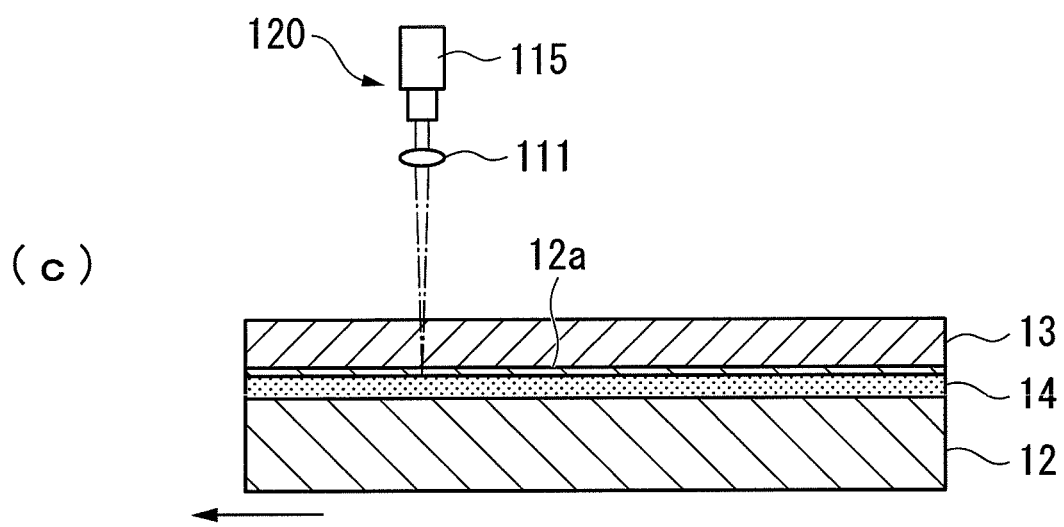
Figure 3:
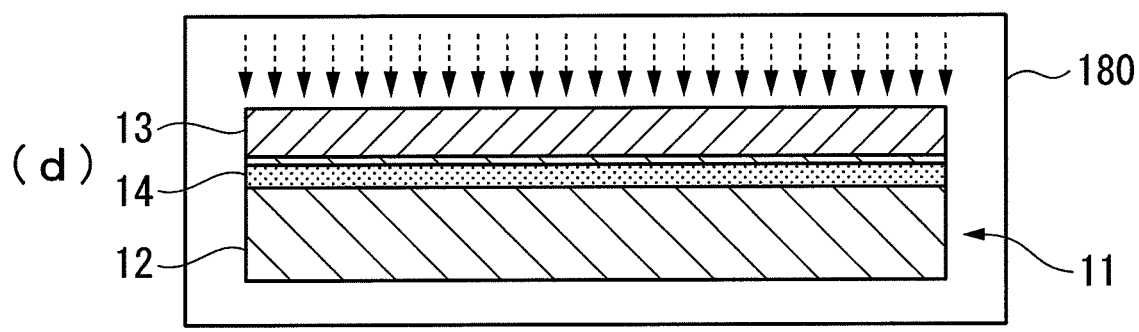

Next, a method of manufacturing the epitaxial substrate for a solid-state imaging device according to the invention will be described. FIG. 3 is a cross-sectional view illustrating an outline of a method of manufacturing the epitaxial substrate for a solid-state imaging device. In manufacturing the epitaxial substrate (epitaxial substrate for a solid-state imaging device), first, the semiconductor wafer 12 is prepared (see FIG. 3(a)). The semiconductor wafer 12 may be, for example, a silicon single crystal wafer manufactured by slicing a silicon single crystal ingot.

Next, the epitaxial layer 13 is formed on one surface 12a of the semiconductor wafer 12 (see FIG. 3(b)). In forming the epitaxial layer 13, for example, using an epitaxial growth system, a raw material gas may be introduced while the semiconductor wafer 12 is heated to a predetermined temperature, and the epitaxial layer 13 made of a silicon single crystal may be grown on one surface 12a.

Next, the semiconductor wafer 12 in which the epitaxial layer 13 is formed is set in a laser irradiation apparatus 120, and laser beam irradiation is performed from the epitaxial layer 13 side while the semiconductor wafer 12 is moved (see FIG. 3(c)). At this time, a laser beam emitted from a laser generating apparatus 115 is condensed by a condensing lens (condensing means) 111 so that the condensing point (focal point) is positioned at a depth of several tens of μm or so from one surface 12a of the semiconductor wafer 12. Thereby, at such a deep region, the crystal structure of the semiconductor wafer 12 is modified, and the gettering sink 14 is formed. A layer which is not modified remains across the entirety thereof at a substantially constant thickness between the gettering sink 14 and the epitaxial layer 13. The step of forming the gettering sink 14 will be described later in detail.

The semiconductor wafer 12 in which the epitaxial layer 13 and the gettering sink 14 are formed is further heated to a predetermined temperature by an annealing apparatus 180 (see FIG. 3(d)). Thereby, heavy metals diffused within the semiconductor wafer 12 are collected in the gettering sink 14, and the epitaxial substrate 11 for a solid-state imaging device having an extremely small amount of heavy metals in the element forming portion is obtained.

Figure 4:
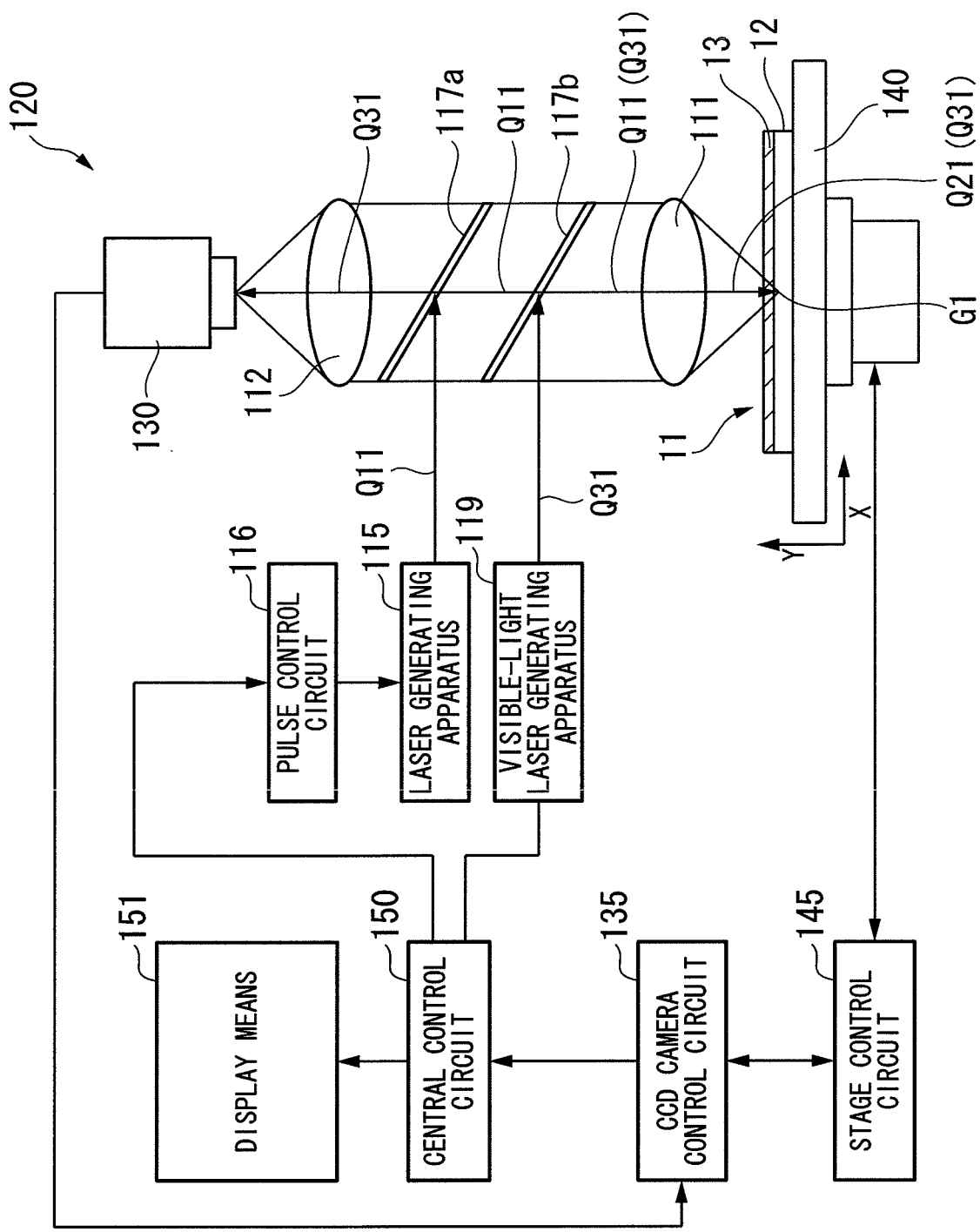
FIG. 4 is a block diagram illustrating a laser irradiation apparatus for performing an embodiment of the manufacturing method.

FIG. 4 is a schematic view illustrating an example of a laser irradiation apparatus for forming the gettering sink on the semiconductor wafer. The laser irradiation apparatus 120 includes the laser generating apparatus 115 that pulse-oscillates a laser beam Q11, a pulse control circuit (Q switch) 116 that controls a pulse and the like of the laser beam Q11, a beam splitter (half mirror) 117a that reflects the laser beam Q11 and turns the traveling direction of the laser beam Q11 toward the semiconductor wafer 12 to 90 degrees, and the condensing lens (condensing means) 111 that condenses the laser beam Q11 reflected by the beam splitter 117a.

This apparatus includes a stage 140 that places the semiconductor wafer 12 in which the epitaxial layer 13 is formed. The stage 140 is controlled movably in the vertical direction Y and the horizontal direction X by a stage control circuit 145 in order to condense and focus a condensed laser beam Q21 at an arbitrary position of the semiconductor wafer 12.

The laser generating apparatus 115 and the pulse control circuit 116 are not particularly limited, insofar as they can perform irradiation with a laser beam capable of modifying a crystal structure at an arbitrary position inside the semiconductor wafer to thereby form the gettering sink. In particular, it is preferable to use a titanium sapphire laser in which oscillation in a wavelength band capable of being transmitted through the semiconductor wafer and in a short pulse period is possible. Table 1 shows a specific example of the proper laser irradiation conditions in each of the normal semiconductor wafer and the silicon wafer.

TABLE 1

| | Laser irradiation conditions | |
|---|---|---|
| Wafer species | Semiconductor wafer | Silicon wafer |
| Beam wavelength | 300 to 1,200 nm | 1,000 to 1,200 nm |
| Beam diameter | 0.1 to 100 μm | 0.5 to 1.0 μm |
| Repetition frequency | 0.001 to 100 MHz | 10 to 100 MHz |
| Pulse width | $1.0 \times 10^{-15}$ to $1.0 \times 10^{-8}$ sec | $1.0 \times 10^{-15}$ to $1.0 \times 10^{-9}$ sec |
| Output power | 1 to 1000 mJ/pulse | 1 to 100 mJ/pulse |

The stage 140 is controlled in the vertical direction Y so that the laser beam Q11 generated by the laser generating apparatus 115 converges the width of the light path through a condensing lens 111, and the converged laser beam Q21 is focus-imaged (condensed) at an arbitrary depth position G1 of the semiconductor wafer 12. The condensing lens 111 preferably has, for example, a magnification of 10 to 300, an N.A of 0.3 to 0.9, and a transmittance with respect to the wavelength of the laser beam of 30 to 60%.

The laser irradiation apparatus 120 further includes a visible-light laser generating apparatus 119, a beam splitter (half mirror) 117b, a CCD camera 130, a CCD camera control circuit 135, an imaging lens 112, a central control circuit 150, and a display means 151.

A visible-light laser beam Q31 generated by the visible-light laser generating apparatus 119 is reflected by the beam splitter (half mirror) 117b and turns around 90 degrees, and then reaches the epitaxial layer 13 of the semiconductor wafer 12. The laser beam is reflected from the surface of the epitaxial layer 13, and reaches the imaging lens 112 by being transmitted through the condensing lens 111 and the beam splitters 117a and 117b. The visible-light laser Q31 reaching the imaging lens 112 is imaged onto the CCD camera 130 as a surface image of the semiconductor wafer 12, and imaging data are input to the CCD camera control circuit 135. The stage control circuit 145 controls the amount of movement in the horizontal direction X of the stage 140 on the basis of the input imaging data.

Figure 5:
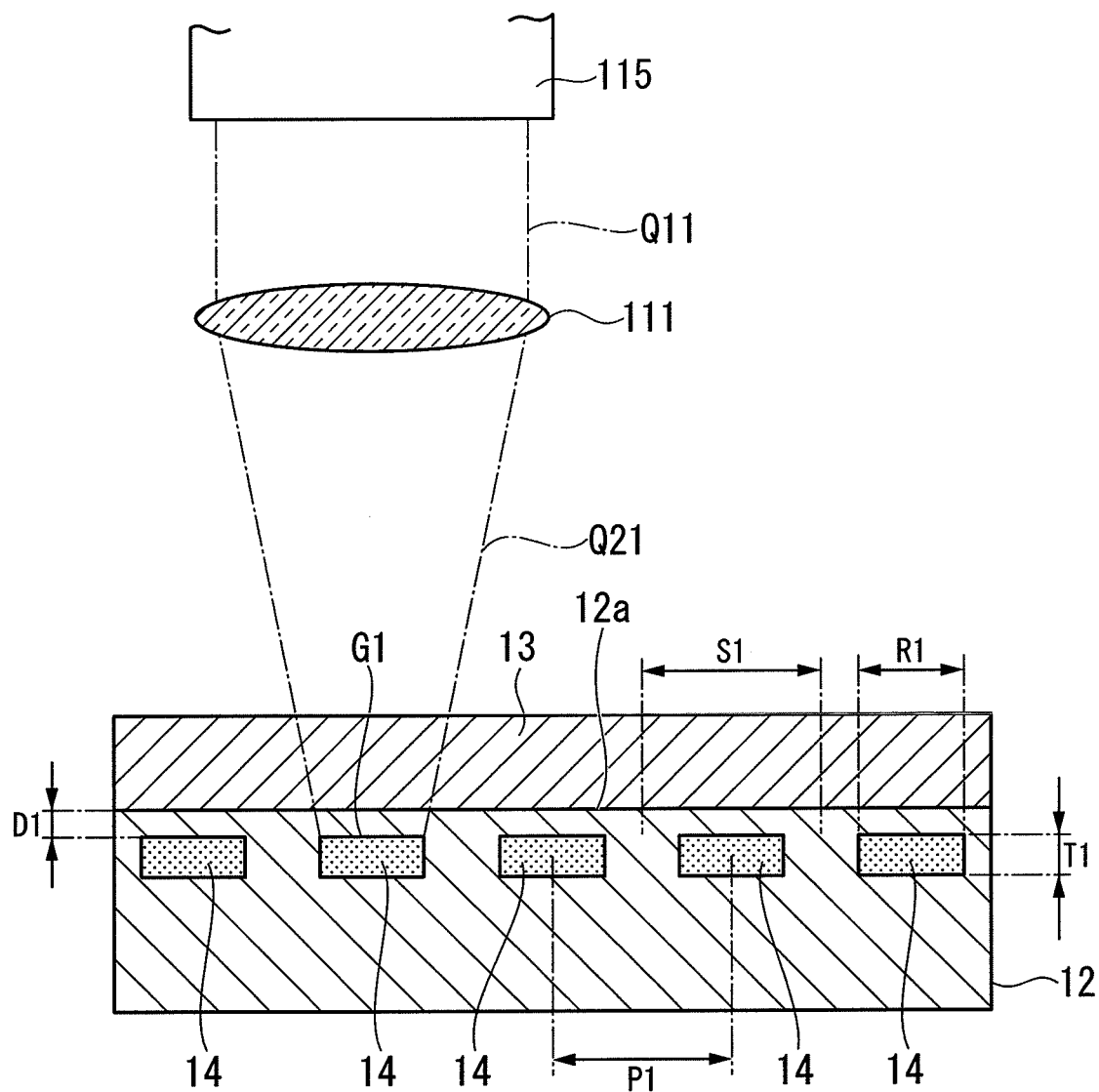
FIG. 5 is an enlarged cross-sectional view illustrating an operation of the apparatus.

Next, a method of forming the gettering sink in the semiconductor wafer 12 in which the epitaxial layer 13 is formed will be described in detail. FIG. 5 is a schematic view illustrating a state where the gettering sink is formed in the semiconductor wafer by the laser beam. When the gettering sink is formed in the semiconductor wafer 12, the laser beam Q11 emitted from the laser generating apparatus 115 is converged by the condensing lens (condensing means) 111. The converged laser beam Q21 has a wavelength band capable of being transmitted through the silicon, and thus after the laser beam reaches the surface of the epitaxial layer 13, it is not reflected and is incident on the surface as it is.

The semiconductor wafer 12 in which the epitaxial layer 13 is formed is positioned so that the condensing point (focal point) of the laser beam Q21 is set to a predetermined depth D1 from one surface 12a of the semiconductor wafer 12. Thereby, in the semiconductor wafer 12, a multi-photon absorption process occurs only in the condensing point (focal point) of the laser beam Q21.

The multi-photon absorption process is a process, as is well known in the art, in which a specific area (irradiated region) is irradiated with a large amount of photons in a very short period of time, so that a large amount of energy is selectively absorbed only into the irradiated region, to thereby cause reaction such as a change in the crystal bonding of the irradiated region. In the invention, by condensing the laser beam in an arbitrary region inside the semiconductor wafer 12, the semiconductor wafer having a single crystal structure is modified at the condensing point (focal point), and a partially amorphous-like crystal structure is generated. The modifying of the crystal structure may be performed to an extent that the operation of capturing heavy metals is generated, that is, a little distortion is generated in the crystal structure.

As described above, the condensing point (focal point) of the laser beam Q21 on which the laser beam Q11 is converged is set at an arbitrary microscopic region inside the semiconductor wafer 12, and the crystal structure of the microscopic region is modified, to thereby allow the gettering sink 14 to be formed in the arbitrary microscopic region of the semiconductor wafer 12.

It is important that the laser beam for forming the gettering sink 14 does not modify the crystal structure of the epitaxial layer 13 or the semiconductor wafer 12 in the light path before the laser beam reaches the condensing point (focal point), and is set to conditions in which the laser beam is able to be reliably transmitted. The irradiation conditions of the laser beam to be used are determined based on a forbidden band (energy band gap) which is a basic physical property value of a semiconductor material. For example, since the forbidden band of the silicon semiconductor is 1.1 eV, the laser beam has a remarkable transmission property in the case where the incident wavelength is 1,000 nm or more. In this manner, the wavelength of the laser beam to be used can be determined based on the forbidden band of the semiconductor material.

As a laser beam generating apparatus, since there may be a concern that thermal energy is transferred to not only a predetermined depth position but also the peripheral region thereof by a high-power laser such as a YAG laser, it is preferable to use a low-energy laser. As a low-energy laser, for example, an ultra-short pulsed laser such as a femtosecond laser is preferably used.

In the ultra-short pulsed laser, the wavelength of the laser beam can be set to an arbitrary range by exciting a titanium-sapphire crystal (solid-state laser crystal) using a semiconductor laser and the like. In the ultra-short pulsed laser, the pulse width of an excited laser beam can be set to $1.0 \times 10^{-15}$ femtoseconds or less. Therefore, compared to other lasers, it is possible to suppress the diffusion of thermal energy generated by excitation, and to concentrate light energy only on the condensing point (focal point) of the laser beam.

The gettering sink 14 formed by modifying the crystal structure by the multi-photon absorption process is assumed to have a probable amorphous-like crystal structure. In order to obtain such an amorphous-like crystal structure, it is necessary to locally rapidly heat and rapidly cool the condensing point (focal point) G1 using the laser beam. The ultra-short pulsed laser having the characteristics as shown in Table 1 is a laser having a small amount of energy. However, the ultra-short pulsed laser is condensed using the condensing lens 111, whereby it has an energy sufficient to locally rapidly heat the semiconductor substrate 12. The temperature of the condensing point (focal point) G1 of the laser beam reaches a high temperature of 9,900 to 10,000 K. The heat input range is considerably narrow due to condensation of the laser beam. Therefore, when the stage in which the semiconductor wafer 12 is placed is moved, or the condensing point (focal point) is moved by scanning of the laser beam, the amount of heat input in the condensing point (focal point) before the movement is drastically reduced, and thus a rapid cooling effect is obtained. The number of irradiated pulses per one irradiation point is preferably 10 to 10,000, and more preferably 10 to 100.

By setting the wavelength thereof to 1,000 nm as in the ultra-short pulsed laser shown in Table 1, it is possible to enhance the transmission property for the epitaxial layer 13 or the semiconductor wafer 12, and to modify only the microscopic region which is a condensing point (focal point) of the laser beam without affecting a crystal structure such as the epitaxial layer 13. The modified portion of the crystal structure can be suitably used as the gettering sink 14 of the semiconductor substrate 12. When the wavelength of the laser beam exceeds 1,200 nm, photon energy (laser beam energy) decreases because of the long-wavelength region. For this reason, since there may be a concern that photon energy sufficient to modify the inside of the semiconductor substrate cannot be obtained even by condensing the laser beam, the wavelength of the laser beam is preferably set to 1,200 nm or less.

The position of the condensing point (focal point) G1 of the laser beam, that is, the position at which the gettering sink 14 is formed in the semiconductor substrate 12 can be controlled by the vertical movement of the stage. In addition to the vertical movement of the stage, the position of the condensing point (focal point) G1 of the laser beam can also be controlled by controlling the position of the condensing means (condensing lens).

As an example, when the gettering sink 14 is formed by modifying the portion located at a depth of 2 μm from the surface 12a of the semiconductor substrate 12, the wavelength of the laser beam is set to 1,080 nm, and the laser beam is imaged (condensed) at the position located at a depth of 2 μm from the surface using a condensing lens (50-fold magnification) having a transmittance of 60%, thereby allowing the modified portion (gettering sink) to be formed by causing the multi-photon absorption process to occur.

In this manner, the gettering sink 14 obtained by modifying the crystal structure of the microscopic region of the semiconductor substrate 12 may be formed, for example, in the shape of a disk having a diameter R1 of 50 to 150 μm and a thickness T1 of 10 to 150 μm. The depth D1 at which the gettering sink 14 is formed is preferably 0.5 to 2 μm or so from one surface 12a of the semiconductor substrate 12.

Each of the gettering sinks 14 may be formed at least at the position that overlaps the solid-state imaging device forming region S1 of the epitaxial substrate 11. The gettering sink 14 may be formed, for example, at intervals with a formation pitch P1 of 0.1 to 10 μm. The gettering sink 14 is not only intermittently formed as mentioned above, but also may be, for example, uniformly formed in the entire semiconductor substrate at a predetermined depth with respect to the semiconductor substrate.

Figure 6:
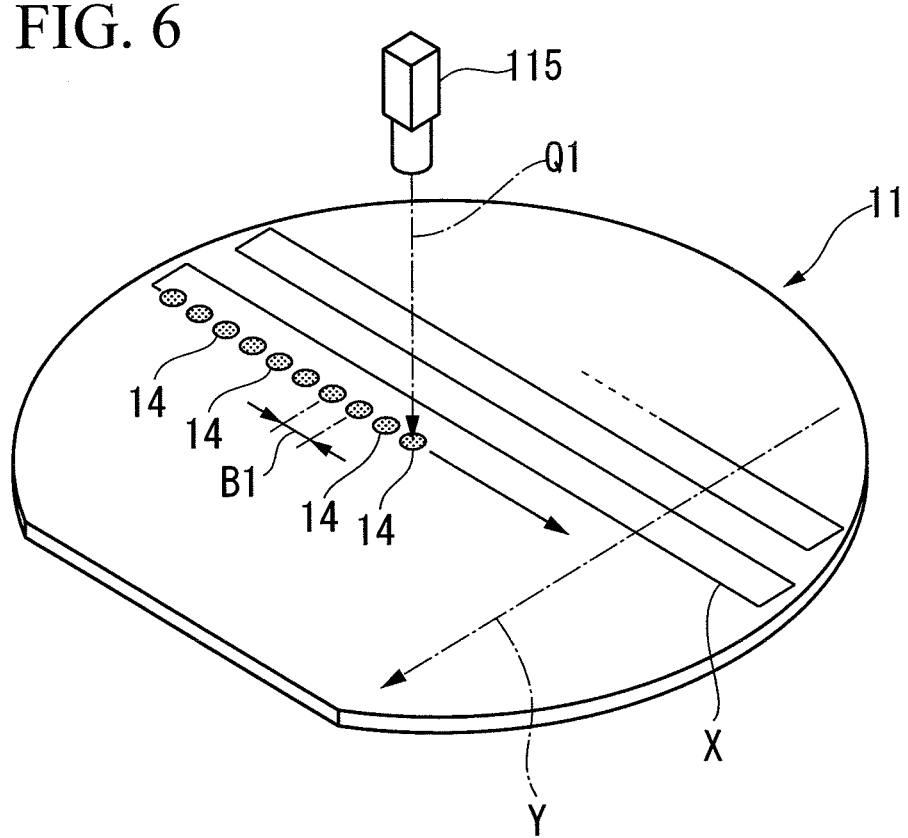
FIG. 6 is a perspective view for explaining an embodiment of the manufacturing method according to the invention.

FIG. 6 is a schematic view illustrating a state where the gettering sink is formed in the epitaxial substrate. The gettering sinks 14 may be respectively formed at the lower portion of the solid-state imaging device forming region S1 in the epitaxial substrate 11. For example, when the laser beam Q1 is scanned along the X direction while sliding the epitaxial substrate 11 in the Y direction at the outer edge thereof so that the laser beam is scanned throughout the entirety of the epitaxial substrate 11, and irradiation with the laser beam Q1 is performed under the predetermined conditions, it is possible to form the gettering sinks 14, 14 . . . in the entire epitaxial substrate 11.

The formation density of the gettering sink 14 in the entire epitaxial substrate 11 can be set by the scanning pitch B1 of the laser beam Q1. The formation density of the gettering sink 14 is preferably set to, for example, a range of $1.0 \times 10^5$ to $1.0 \times 10^7$ counts/cm². The formation density of the gettering sink 14 can be verified by the number of oxygen precipitates obtained by the observation using a cross-sectional TEM (transmission electron microscope).

As described above, according to the method of manufacturing the epitaxial substrate for a solid-state imaging device of the invention, it is possible to form, easily and in a short time, the gettering sink in which only the crystal structure of an arbitrary microscopic region inside the semiconductor substrate is changed, by causing the laser beam to be incident on the epitaxial substrate through the condensing means and condensing the laser beam in the microscopic region, to cause the multi-photon absorption process to occur in the microscopic region inside the semiconductor substrate.

Thereby, heat treatment for a long period of time is not required for forming the gettering sink as in the related art, and thus it is possible to simplify the step of manufacturing the epitaxial substrate for a solid-state imaging device, and to reduce the manufacturing costs. It is possible to easily form the gettering sink in the inside of the semiconductor substrate even with respect to the substrate polished on both sides represented by a wafer having a diameter of 300 mm and the like.

[Semiconductor Device]

Next, the best embodiments of a semiconductor device according to the invention and a method of manufacturing the same will be described with reference to the drawings by taking a NAND-type flash memory as an example of the semiconductor device.

Figure 7:
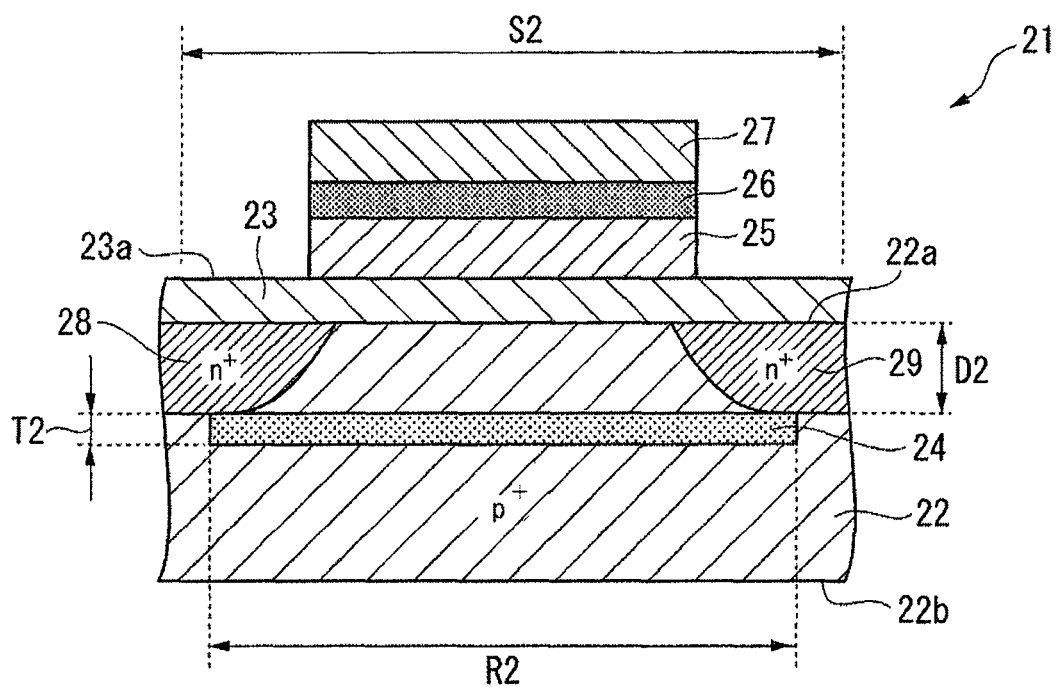
FIG. 7 is a cross-sectional view illustrating an embodiment of a semiconductor device according to the invention.

FIG. 7 is an enlarged cross-sectional view illustrating a NAND-type flash memory which is an example of the semiconductor device according to the invention. A NAND-type flash memory (semiconductor device) 21 includes a $p^+$-type semiconductor substrate 22 and a first insulating film 23 formed on one surface 22a of the semiconductor substrate 22. A floating gate 25, a second insulating film 26, and a control gate 27 are formed in this order on one surface 23a of the first insulating film 23.

An $n^+$-type source region 28 and a drain region 29 are respectively formed around the region for forming the floating gate 25 at one surface 22a side of the semiconductor substrate 22. A gettering sink 24 for capturing heavy metals of the semiconductor substrate 22 is formed at the position that overlaps the device forming region S2 in the semiconductor substrate 22, for example, the position that overlaps the region in which the floating gate 25, the second insulating film 26, the control gate 27 and the like are laminated.

The semiconductor substrate 22 may be, for example, a silicon single crystal wafer. The first insulating film 23 may be a $SiO_2$ film obtained by oxidizing the surface of the silicon single crystal wafer. The second insulating film 26 may be, for example, a silicon nitride (SiN) film.

The gettering sink 24 may have an amorphous-like structure in which a portion of the silicon single crystal is made amorphous. The gettering sink 24 has a capability to capture heavy metals just by the existence of a little distortion in the crystal structure thereof, and can play a role as a gettering sink just by making amorphous only a small fraction thereof The gettering sink 24 is formed by causing a multi-photon absorption process to occur in a portion of the semiconductor substrate 22 to thereby modify a crystal structure, by condensation of a laser beam. A method of forming such a gettering sink 24 will be described later in detail in a method of manufacturing a semiconductor device.

The gettering sink 24 may be formed at the position that overlaps at least the individual device forming regions S2. For example, one gettering sink 24 may be formed in the shape of a disk having a diameter R2 of 50 to 150 μm, more preferably 75 to 125 μm, and a thickness T2 of 10 to 150 μm, more preferably 10 to 100 μm. The depth D2 at which the gettering sink 24 is formed is preferably 0.5 to 2 μm or so from one surface 22a of the semiconductor substrate 22. D2 is more preferably 0.8 to 1.5 μm.

In the NAND-type flash memory 21 having such a configuration, when a control voltage is applied to the control gate 27, electrons are injected toward the floating gate 25 by tunneling the first insulating film 23 from the $p^+$-type semiconductor substrate 22. Thereby, data are set to a written state. The floating gate 25 is surrounded by insulators such as the first insulating film 23 or the second insulating film 26, and thus retains a storage state even when a power supply is disconnected.

On the other hand, by applying a predetermined voltage to the $p^+$-type semiconductor substrate 22, the electrons retained in the floating gate 25 are moved toward the semiconductor substrate 22 by tunneling the insulating film 23. Thereby, data are set to an erased state, and the electrons are injected.

In such a NAND-type flash memory 21, since heavy metals are reliably captured by the gettering sink 24 formed in the semiconductor substrate 22, it is possible to suppress a leakage current which is the cause of a decrease in the characteristics of the NAND-type flash memory 21. Consequently, it is possible to realize the NAND-type flash memory 21, having a small amount of a leakage current and excellent storage characteristics.

The semiconductor device according to the invention is not limited to the NAND-type flash memory as mentioned above, and can be similarly applied to, for example, various types of semiconductor devices represented by a flash memory such as a NOR-type flash memory, or a semiconductor memory such as a DRAM.

Figure 8:
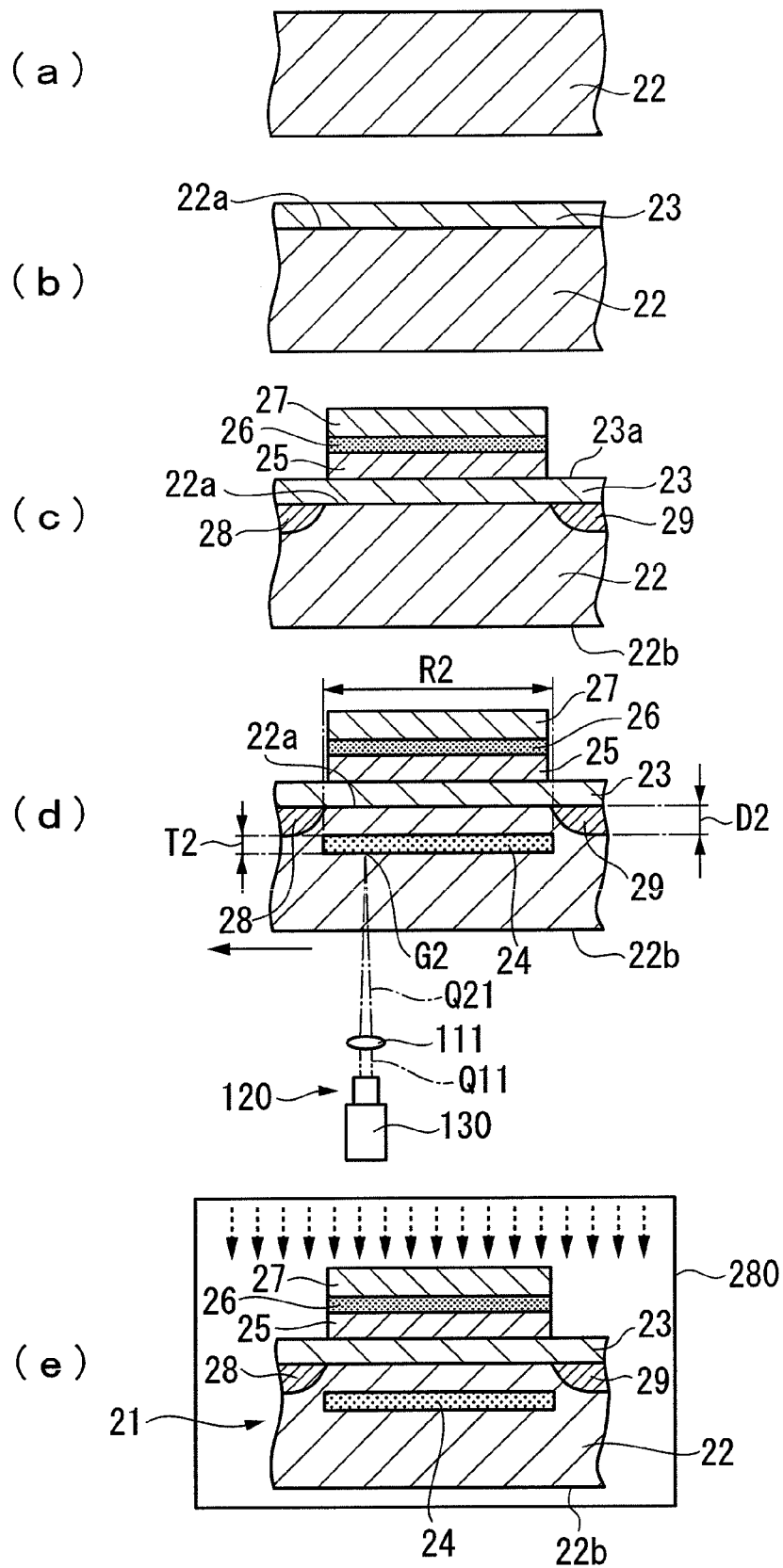
FIG. 8 is a cross-sectional view illustrating an embodiment of a method of manufacturing the semiconductor device according to the invention.

Next, a method of manufacturing the semiconductor device according to the invention will be described by taking the above-mentioned NAND-type flash memory as an example. FIG. 8 is a cross-sectional view illustrating an outline of a method of manufacturing the semiconductor device in a step-by-step manner. In manufacturing the NAND-type flash memory (semiconductor device), first, the semiconductor substrate 22 is prepared (see FIG. 8(a)). The semiconductor substrate 22 may be, for example, a silicon single crystal wafer manufactured by slicing a silicon single crystal ingot.

Next, the first insulating film 23 is formed on one surface 22a of the semiconductor substrate 22 (see FIG. 8(b)). The first insulating film 23 may be, for example, a silicon oxide film ($SiO_2$) obtained by oxidizing one surface of the silicon single crystal wafer. In forming the silicon oxide film 23, for example, using an annealing apparatus, the semiconductor substrate 22 may be heated to a predetermined temperature, and the surface thereof may be oxidized.

Next, for example, through photolithography and the like, a device (NAND memory element) constituted by the floating gate 25, the second insulating film 26, the control gate 27, the source region 28, the drain region 29 and the like are formed on one surface 22a of the semiconductor substrate 22 (see FIG. 8(c)).

Figure 9:
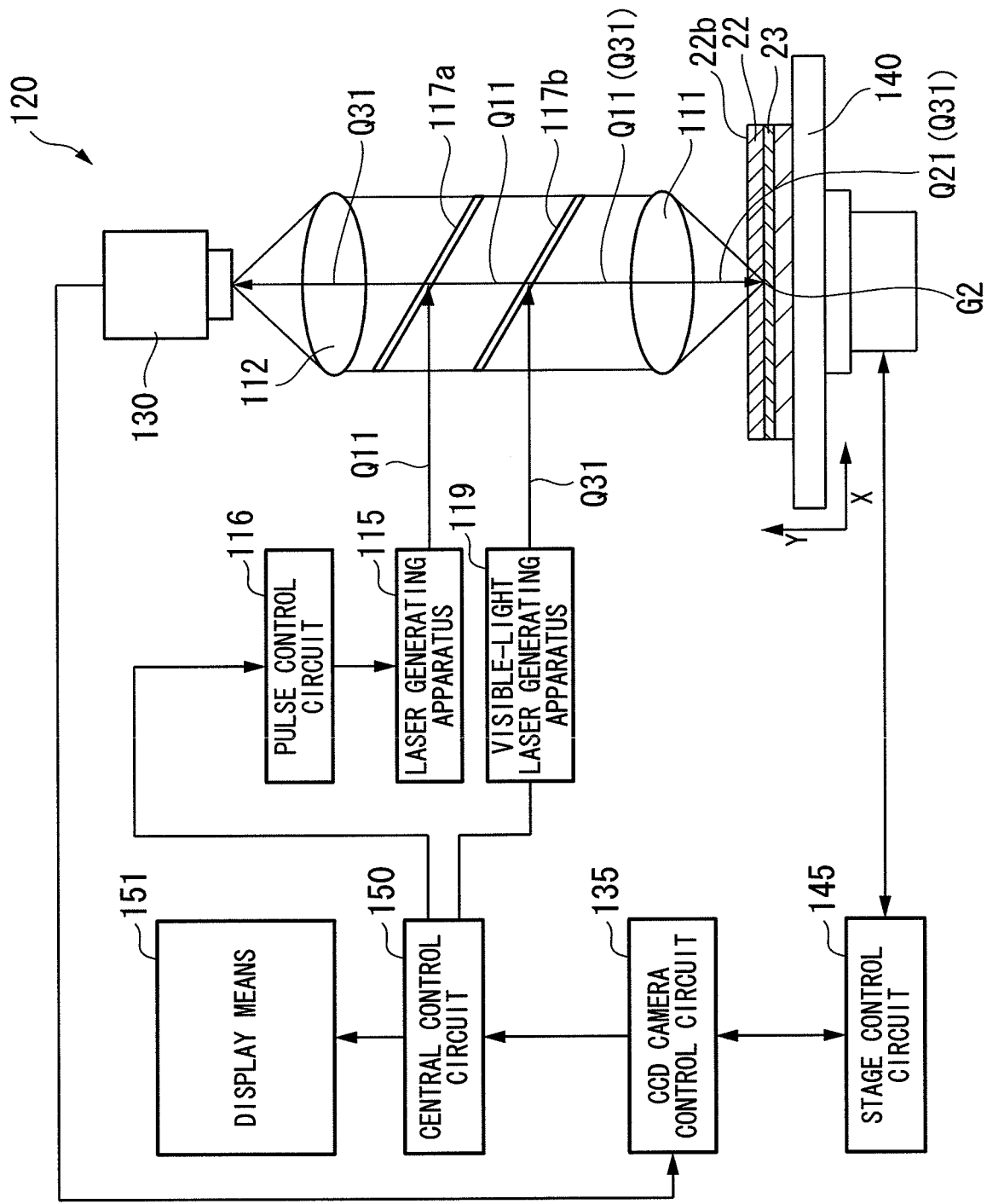
FIG. 9 is a schematic view illustrating an example of the laser irradiation apparatus used in forming a gettering sink.

Next, the gettering sink 24 is formed by performing laser beam irradiation from the other surface (back surface) 22b side of the semiconductor substrate 22 in which the device (NAND memory element) is formed (see FIG. 8(d)). FIG. 9 is a schematic view illustrating an example of the laser irradiation apparatus 120 for forming the gettering sink in the semiconductor substrate. The laser irradiation apparatus 120 may be the same as that used in the embodiment previously described. The proper laser irradiation conditions may be the same as those of the above-mentioned Table 1.

The stage 140 is controlled in the vertical direction Y so that the laser beam Q11 generated by the laser generating apparatus 115 converges the width of the light path through a condensing lens 111, and the converged laser beam Q21 is focus-imaged (condensed) at an arbitrary depth position G2 of the semiconductor substrate 22. The condensing lens 111 preferably has, for example, a magnification of 10 to 300, an N.A of 0.3 to 0.9, and a transmittance with respect to the wavelength of the laser beam of 30 to 60%.

The visible-light laser beam Q31 generated by the visible-light laser generating apparatus 119 is reflected by the beam splitter (half mirror) 117b and turns around 90 degrees, and then reaches the semiconductor substrate 22. The visible-light laser beam Q31 is reflected from the surface (the other surface 22b side) of the semiconductor substrate 22, and reaches the imaging lens 112 by being transmitted through the condensing lens 111 and the beam splitters 117a and 117b. The visible-light laser Q31 reaching the imaging lens 112 is imaged onto the CCD camera 130 as a surface image of the semiconductor substrate 22, and imaging data are input to the CCD camera control circuit 135. The stage control circuit 145 controls the amount of movement in the horizontal direction X of the stage 140 on the basis of the input imaging data.

Next, a method of forming the gettering sink in the semiconductor substrate 22 in which the device is formed will be described in detail. When the gettering sink is formed in the inside of the semiconductor substrate 22, first, the semiconductor substrate 22 is placed so that the other surface 22b side corresponds to the upper surface (laser incidence plane) with respect to the stage 140. The laser beam Q11 emitted from the laser generating apparatus 115 is converged by the condensing lens (condensing means) 111. The converged laser beam Q21 has a wavelength band capable of being transmitted through the silicon, and thus after the laser beam reaches the other surface 22b of the semiconductor substrate 22, it is not reflected and is incident on the other surface as it is.

The semiconductor substrate 22 is positioned so that the condensing point (focal point) of the laser beam Q21 is set to a predetermined depth D2 from one surface 22a of the semiconductor substrate 22. Thereby, in the semiconductor substrate 22, a multi-photon absorption process occurs only in the condensing point (focal point) of the laser beam Q21.

In the invention, by condensing the laser beam in an arbitrary region inside the semiconductor substrate 22, the semiconductor wafer having a single crystal structure is modified at the condensing point (focal point), and a partially amorphous-like crystal structure is generated. The modifying of the crystal structure may be performed to an extent that the operation of capturing heavy metals is generated, that is, a little distortion is generated in the crystal structure.

As described above, the condensing point (focal point) of the laser beam Q21 on which the laser beam Q11 is converged is set at an arbitrary microscopic region inside the semiconductor substrate 22, and the crystal structure of the microscopic region is modified, to thereby allow the gettering sink 24 to be formed in the arbitrary microscopic region of the semiconductor substrate 22.

It is important that the laser beam for forming the gettering sink 24 does not have an energy for modifying the crystal structure of the semiconductor substrate 22 in the light path before the laser beam reaches the condensing point (focal point), and is set to conditions in which the laser beam is able to be reliably transmitted. The irradiation conditions of the laser beam to be used are determined based on a forbidden band (energy band gap) which is a basic physical property value of a semiconductor material. For example, since the forbidden band of the silicon semiconductor is 1.1 eV, the laser beam has a remarkable transmission property in the case where the incident wavelength is 1,000 nm or more. In this manner, the wavelength of the laser beam to be used can be determined based on the forbidden band of the semiconductor material.

As a laser beam generating apparatus, since there may be a concern that thermal energy is transferred to not only a predetermined depth position but also to the peripheral region thereof by a high-power laser such as a YAG laser, it is preferable to use a low-energy laser. As a low-energy laser, for example, an ultra-short pulsed laser such as a femtosecond laser is preferably used.

In the ultra-short pulsed laser, the wavelength of the laser beam can be set to an arbitrary range by exciting a titanium-sapphire crystal (solid-state laser crystal) using a semiconductor laser and the like. In the ultra-short pulsed laser, the pulse width of an excited laser beam can be set to $1.0 \times 10^{-15}$ femtoseconds or less. Therefore, compared to other lasers, it is possible to suppress the diffusion of thermal energy generated by excitation, and to concentrate light energy only on the condensing point (focal point) of the laser beam.

The gettering sink 24 formed by modifying the crystal structure by the multi-photon absorption process is probably assumed to have an amorphous-like crystal structure. In order to obtain such an amorphous-like crystal structure, it is necessary to locally rapidly heat and rapidly cool the condensing point (focal point) G2 using the laser beam. The ultra-short pulsed laser having the characteristics as shown in Table 1 is a laser having a small amount of energy. However, the ultra-short pulsed laser is condensed using the condensing lens 111, whereby it has an energy sufficient to locally rapidly heat the semiconductor substrate 22. The temperature of the condensing point (focal point) G2 of the laser beam reaches a high temperature of 9,900 to 10,000 K. The heat input range is considerably narrow due to condensation of the laser beam. Therefore, when the stage in which the semiconductor substrate 22 is placed is moved, or the condensing point (focal point) is moved by scanning of the laser beam, the amount of heat input in the condensing point (focal point) before the movement is drastically reduced, and thus a rapid cooling effect is obtained.

By setting the wavelength thereof to 1,000 nm as in the ultra-short pulsed laser shown in Table 1, it is possible to enhance the transmission property for the semiconductor substrate 22, and to modify only the microscopic region which is a condensing point (focal point) of the laser beam without affecting a crystal structure other than a region in which the gettering sink 24 is not formed. The modified portion of the crystal structure can be suitably used as the gettering sink 24 of the semiconductor substrate 22. When the wavelength of the laser beam exceeds 1,200 nm, photon energy (laser beam energy) decreases because of the long-wavelength region. For this reason, since there may be a concern that photon energy sufficient to modify the inside of the semiconductor substrate cannot be obtained even by condensing the laser beam, the wavelength of the laser beam is preferably set to 1,200 nm or less.

The position of the condensing point (focal point) G2 of the laser beam, that is, the position at which the gettering sink 24 is formed in the semiconductor substrate 22 can be controlled by the vertical movement of the stage. In addition to the vertical movement of the stage, the position of the condensing point (focal point) G2 of the laser beam can also be controlled by controlling the position of the condensing means (condensing lens).

As an example, when the gettering sink 24 is formed by modifying the portion located at a depth of 2 μm from the surface of the semiconductor substrate, the wavelength of the laser beam is set to 1,080 nm, and the laser beam is imaged (condensed) at the position located at a depth of 2 μm from the surface using a condensing lens (50-fold magnification) having a transmittance of 60%, thereby allowing the modified portion (gettering sink) to be formed by causing the multi-photon absorption process to occur.

The gettering sink 24 obtained by modifying the crystal structure of the microscopic region of the semiconductor substrate 22 may be formed, for example, in the shape of a disk having a diameter R2 of 50 to 150 μm and a thickness T2 of 10 to 150 μm. The depth D2 at which the gettering sink 24 is formed is preferably 0.5 to 2 μm or so from one surface 22a of the semiconductor substrate 22.

Each of the gettering sinks 24 may be formed at least at the position that overlaps the solid-state imaging device forming region S2 of the semiconductor substrate 22. The gettering sink 24 may be formed, for example, at intervals with a formation pitch between the adjacent gettering sinks 24 of 0.1 to 10 μm. The gettering sink 24 is not only intermittently formed as mentioned above, but also may be, for example, uniformly formed in the entire semiconductor substrate at a predetermined depth with respect to the semiconductor substrate.

The state where the gettering sink is formed in the semiconductor substrate is the same as that of FIG. 6 as previously described, and thus description thereof will be omitted. In FIG. 6, the gettering sink 14(24) may be formed in the lower portion of the element forming region in the semiconductor substrate. For example, when the laser beam Q1 is scanned along the X direction while sliding the semiconductor substrate in the Y direction at the outer edge thereof so that the laser beam is scanned throughout the entirety of the other surface (back surface) of the semiconductor substrate 11(22) in which the device is formed, and irradiation with the laser beam Q1 is performed under predetermined conditions, it is possible to form the gettering sinks 24, 24 . . . in the entire semiconductor substrate 22.

The formation density of the gettering sink 24 can be set by the scanning pitch B1 of the laser beam Q1. The formation density of the gettering sink 24 is preferably set to, for example, a range of $1.0 \times 10^5$ to $10 \times 10^6$ counts/cm$^2$. The formation density of the gettering sink 24 can be verified by the number of oxygen precipitates obtained by the observation using a cross-sectional TEM (transmission electron microscope).

In the manner, the semiconductor substrate 22 in which the gettering sink 24 is formed is further heated to a predetermined temperature by an annealing apparatus 280 (see FIG. 8(e)). Thereby, heavy metals diffused within the semiconductor substrate 22 are collected in the gettering sink 24, and thus it is possible to obtain the NAND-type flash memory (semiconductor device) having an extremely small amount of heavy metals in the element forming portion.

The capturing of heavy metals in the gettering sink 24 using the annealing apparatus is preferably performed after the semiconductor substrate 22 is ground from the other surface 22b side and is thinned. Thereby, even when the semiconductor substrate is contaminated by heavy metals in a thinning step, it is possible to reliably remove heavy metals in the device forming region, and to provide a semiconductor device having no deterioration in characteristics such as the leakage due to heavy metals even when thinned.

As described above, according to the method of manufacturing the semiconductor device of the invention, it is possible to form, easily and in a short time, the gettering sink in which only the crystal structure of an arbitrary microscopic region inside the semiconductor substrate is changed, by causing the laser beam to be incident on the semiconductor substrate through the condensing means and condensing the laser beam in the microscopic region, to cause the multi-photon absorption process to occur in the microscopic region inside the semiconductor substrate.

Thereby, heat treatment for a long period of time is not required for forming the gettering sink as in the related art, and thus it is possible to reliably remove heavy metals even when the semiconductor substrate is thinned. It is possible to easily form the gettering sink in the inside of the semiconductor substrate even with respect to the substrate polished on both sides represented by a wafer having a diameter of 300 mm and the like.

[Epitaxial Substrate for a Solid-State Imaging Device]

Figure 10:
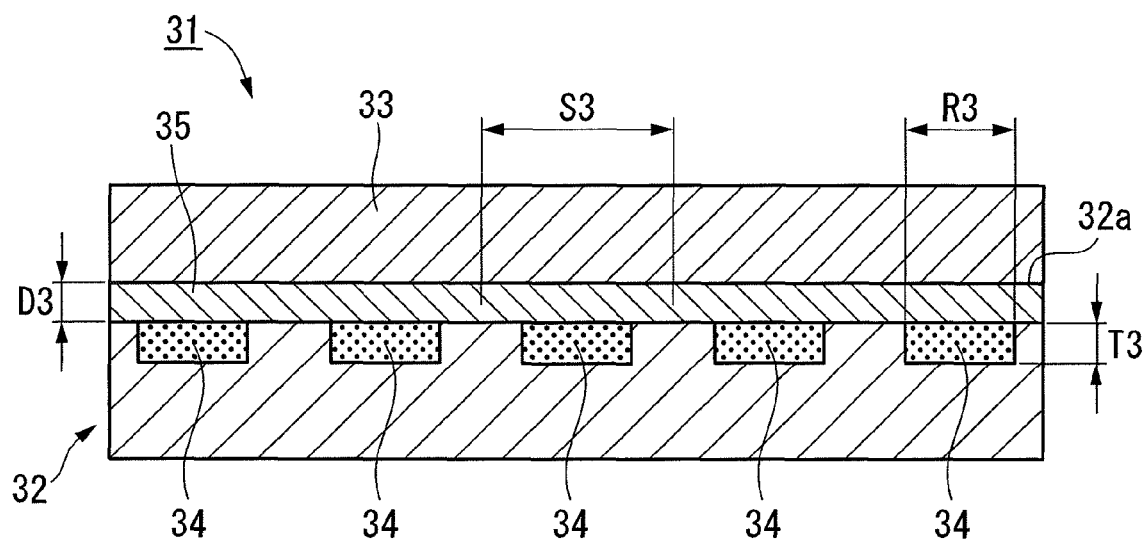
FIG. 10 is a cross-sectional view illustrating an example of the epitaxial substrate for a solid-state imaging device according to the invention.

FIG. 10 is an enlarged cross-sectional view illustrating the epitaxial substrate for a solid-state imaging device according to another embodiment of the invention. An epitaxial substrate (epitaxial substrate for a solid-state imaging device) 31 is a substrate (wafer) suitable for manufacturing a back illuminated solid-state imaging device, and includes a semiconductor substrate 32, a buried oxide film 35 having a SOI structure formed close to one surface 32a of the semiconductor substrate 32, and an epitaxial layer 33 superposedly formed on one surface 32a of the semiconductor substrate 32.

Gettering sinks 34, 34 . . . for capturing heavy metals in the epitaxial substrate 31 is formed in the lower portion of the buried oxide film 35.

Such an epitaxial substrate 31 can be suitably used as a substrate of a back illuminated solid-state imaging device. The semiconductor substrate 32 may be, for example, a silicon single crystal wafer. The epitaxial layer 33 may be an epitaxial growth film of silicon grown from one surface 32a of the semiconductor substrate 32. In the buried oxide film 35, for example, a method of attaching a substrate, in which an oxide film is formed, to the semiconductor substrate, or a method of forming the buried oxide film (BOX layer) 35 in the inside of the semiconductor substrate by implanting oxygen from one surface of the semiconductor substrate through ion implantation, and then heating and oxidizing the semiconductor substrate may be used.

The gettering sink 34 may have an amorphous-like structure in which a portion of a silicon single crystal is made amorphous. The gettering sink 34 has a capability to capture heavy metals just by the existence of a little distortion in the crystal structure thereof, and can play a role as a gettering sink just by making amorphous only a small fraction thereof. The gettering sink 34 is formed by causing a multi-photon absorption process to occur in a portion of the semiconductor substrate 32 to thereby modify a crystal structure, by condensation of a laser beam. A method of forming such a gettering sink 34 will be described later in detail in a method of manufacturing an epitaxial substrate for a back illuminated solid-state imaging device.

When the back illuminated solid-state imaging device is formed using the epitaxial substrate 31, the gettering sinks 34 may be formed at positions that overlap at least each of the back illuminated solid-state imaging device forming regions S3. For example, one gettering sink 34 may be formed in the shape of a disk having a diameter R3 of 50 to 150μm, more preferably 75 to 125μm, and a thickness T3 of 10 to 150 μm, more preferably 10 to 100 μm. The depth D3 at which the gettering sink 34 is formed is preferably 0.5 to 2 μm or so from one surface 22a of the semiconductor substrate 22. The depth D3 is more preferably 0.8 to 1.5 μm.

Figure 11:
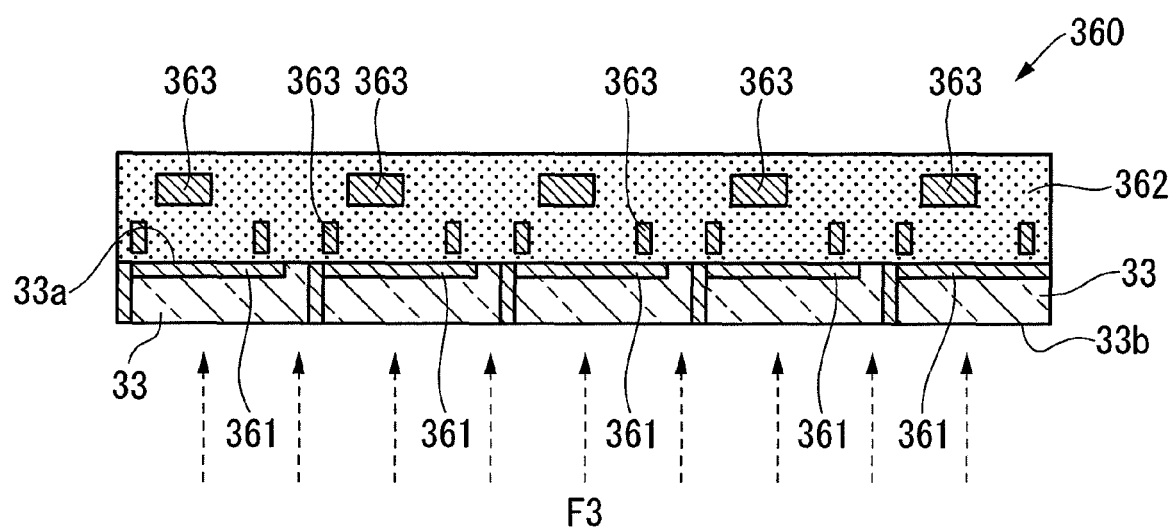
FIG. 11 is a cross-sectional view illustrating an example of a back illuminated solid-state imaging device.

FIG. 11 is a cross-sectional view illustrating an example of a back illuminated solid-state imaging device created using the epitaxial substrate for a solid-state imaging device according to the invention. A back illuminated solid-state imaging device 360 includes a photodiode 361 formed in the epitaxial layer 33, an insulating layer 362 formed on one surface (surface) 33a side of the epitaxial layer 33, and an interconnection 363 formed inside the insulating layer 362. When the back illuminated solid-state imaging device 360 is formed, the semiconductor substrate is removed by grinding, and is thinned. Incident light F3 is incident from the other surface (back surface) 33b side of the epitaxial layer 33, and is detected by the photodiode 361.

In the back illuminated solid-state imaging device 360 having such a configuration, since heavy metals included in the epitaxial layer 33 are reliably captured by the gettering sink 34 formed in the semiconductor substrate 32 of the epitaxial substrate 31 (see FIG. 10) used in the manufacture, it is possible to suppress a dark leakage current of the photodiode 361 which is the cause of a decrease in the imaging characteristics of the back illuminated solid-state imaging device 360. Consequently, it is possible to realize the back illuminated solid-state imaging device 360 having excellent imaging characteristics.

Figure 12:
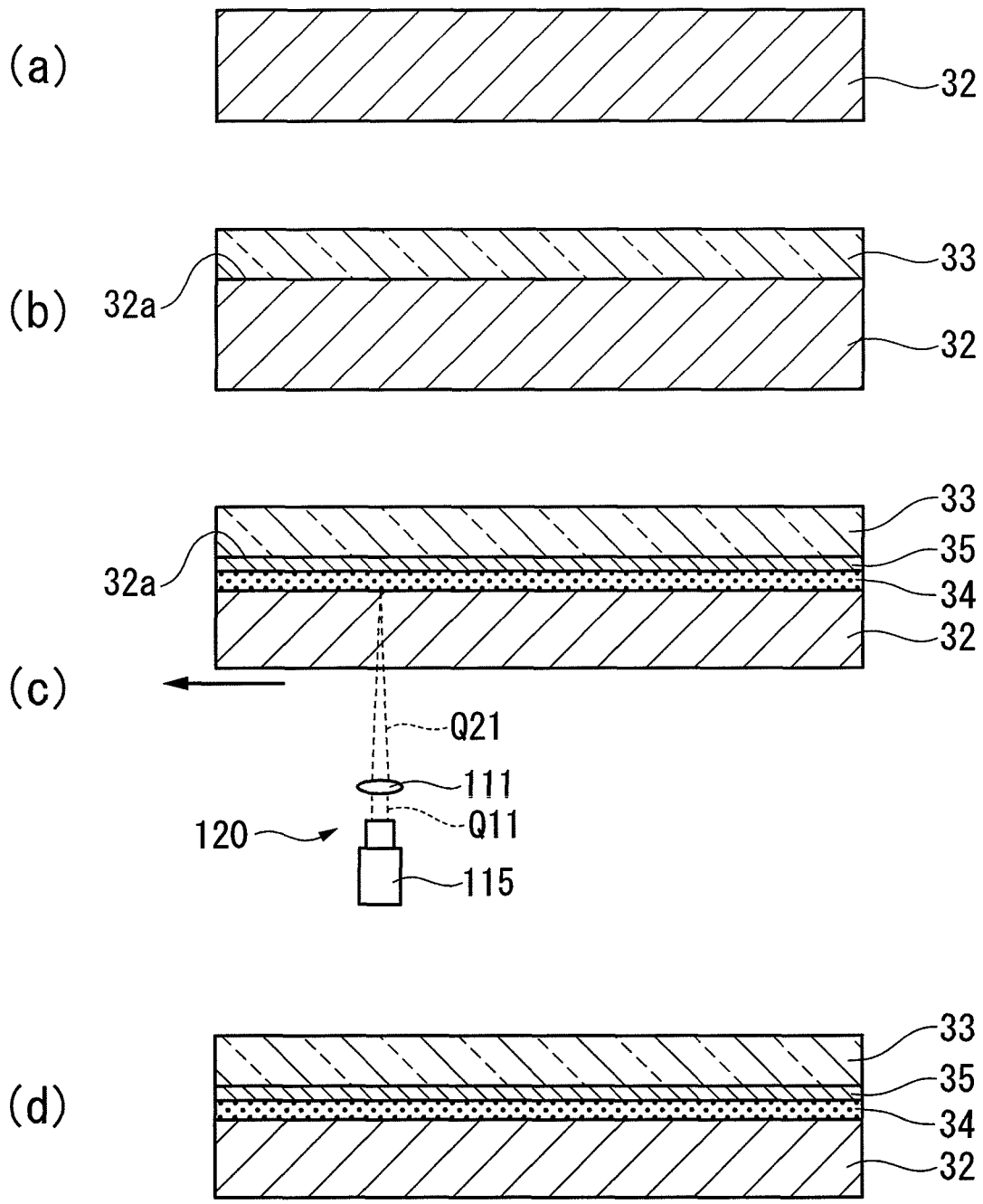
FIG. 12 is a cross-sectional view illustrating an example of a method of manufacturing the back illuminated solid-state imaging device according to the invention.
Figure 13:
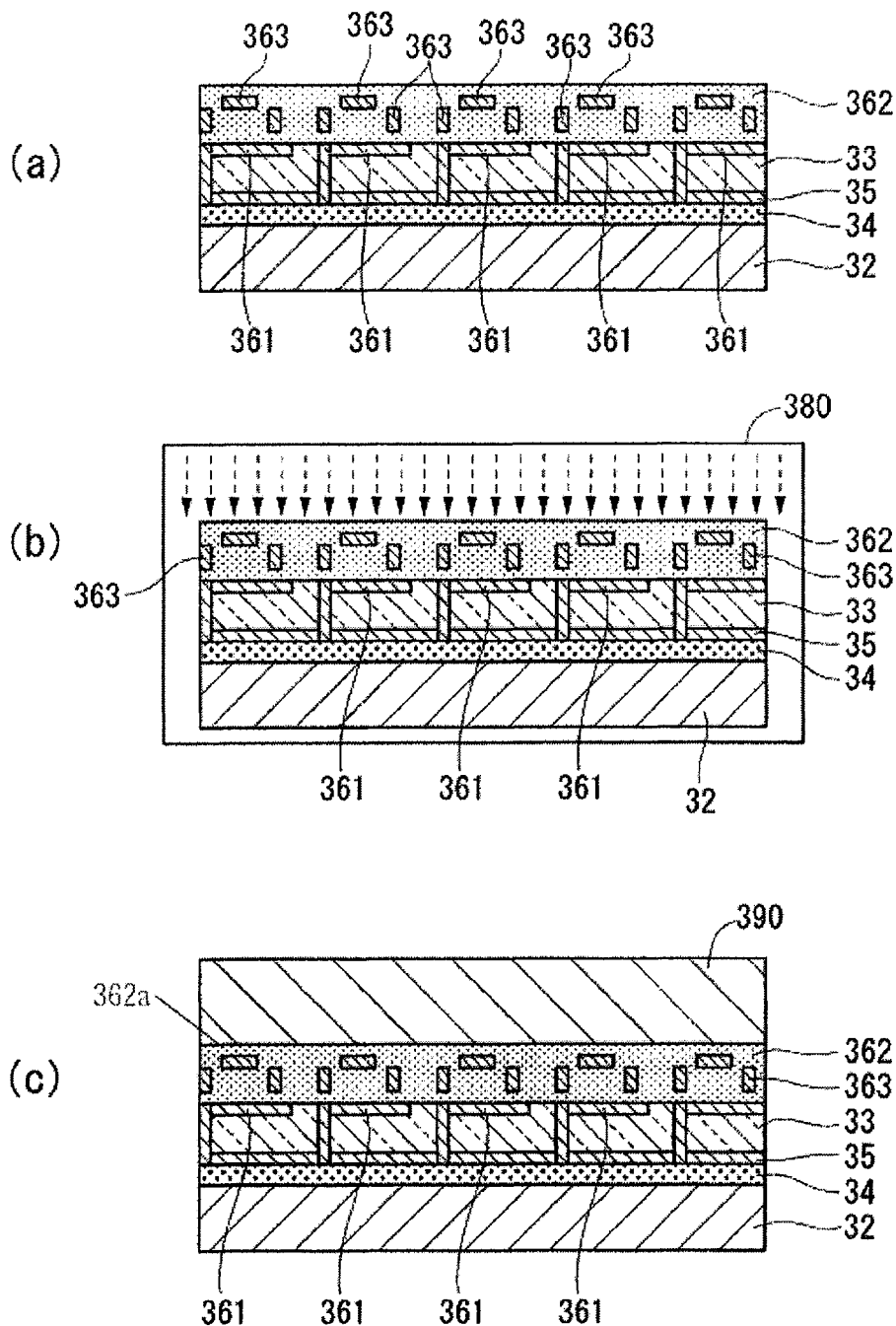
FIG. 13 is a cross-sectional view illustrating an example of the method of manufacturing the back illuminated solid-state imaging device according to the invention.
Figure 14:
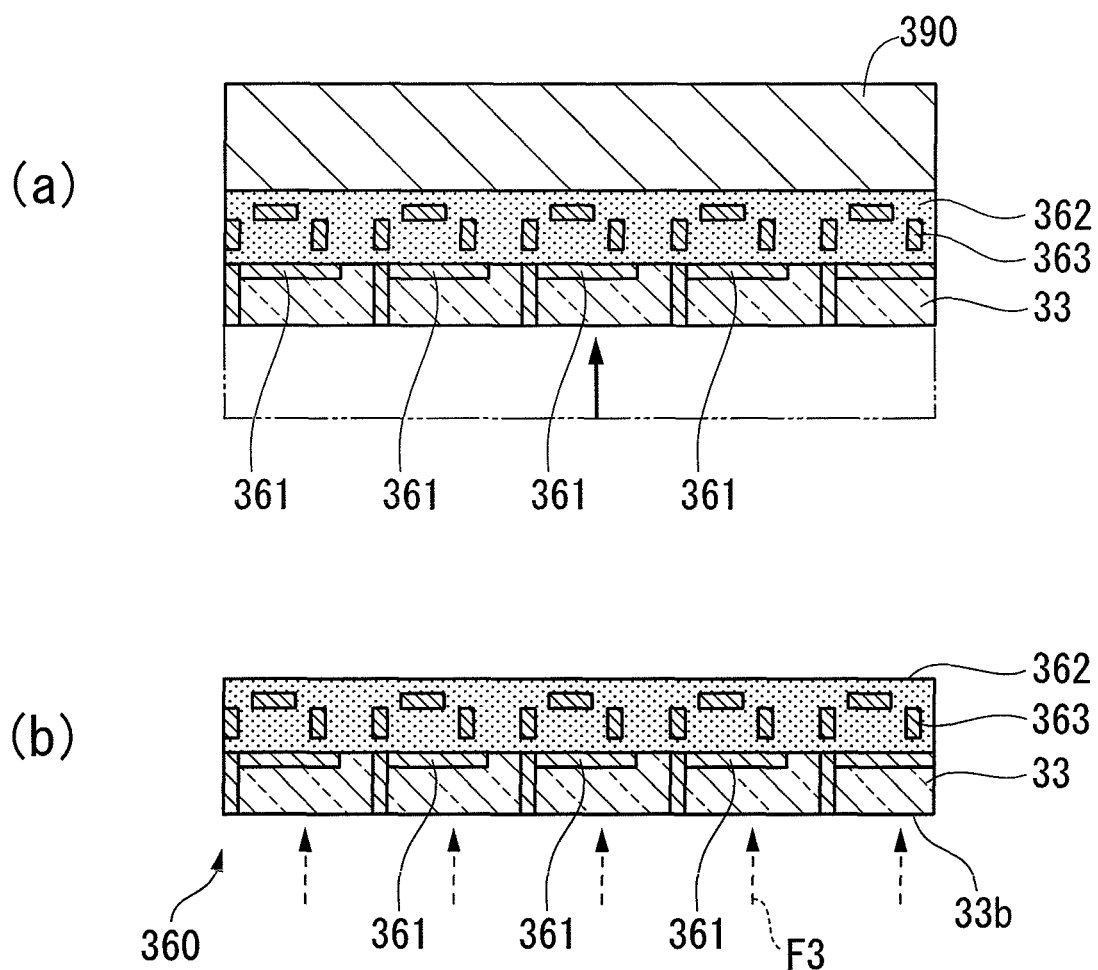
FIG. 14 is a cross-sectional view illustrating an example of the method of manufacturing the back illuminated solid-state imaging device according to the invention.

Next, a method of manufacturing the back illuminated solid-state imaging device according to the invention will be described. FIGS. 12 to 14 are cross-sectional views illustrating an outline of a method of manufacturing the back illuminated solid-state imaging device. In manufacturing the back illuminated solid-state imaging device, first, the semiconductor substrate 32 is prepared (see FIG. 12(a)). The semiconductor substrate 32 may be, for example, a silicon single crystal wafer manufactured by slicing a silicon single crystal ingot.

Next, the epitaxial layer 33 is formed on one surface 32a of the semiconductor substrate 32 (see FIG. 12(b)). In forming the epitaxial layer 33, for example, using an epitaxial growth system, a raw material gas may be introduced while the semiconductor substrate 32 is heated to a predetermined temperature, and the epitaxial layer 33 made of a silicon single crystal may be grown on one surface 32a. It is preferable to form the buried oxide film (BOX layer) 35 in the inside of the semiconductor substrate 32.

Next, the semiconductor substrate 32 on which the epitaxial layer 33 is formed is set in the laser irradiation apparatus 120, and laser beam irradiation is performed while the semiconductor substrate 32 is moved (see FIG. 12(c)). At this time, the laser beam emitted from the laser generating apparatus 115 is condensed by the condensing lens (condensing means) 111 so that the condensing point (focal point) is positioned at a depth of several tens of μm or so from one surface 32a of the semiconductor substrate 32. Thereby, the crystal structure of the semiconductor substrate 32 is modified, and the gettering sink 34 is formed.

Figure 15:
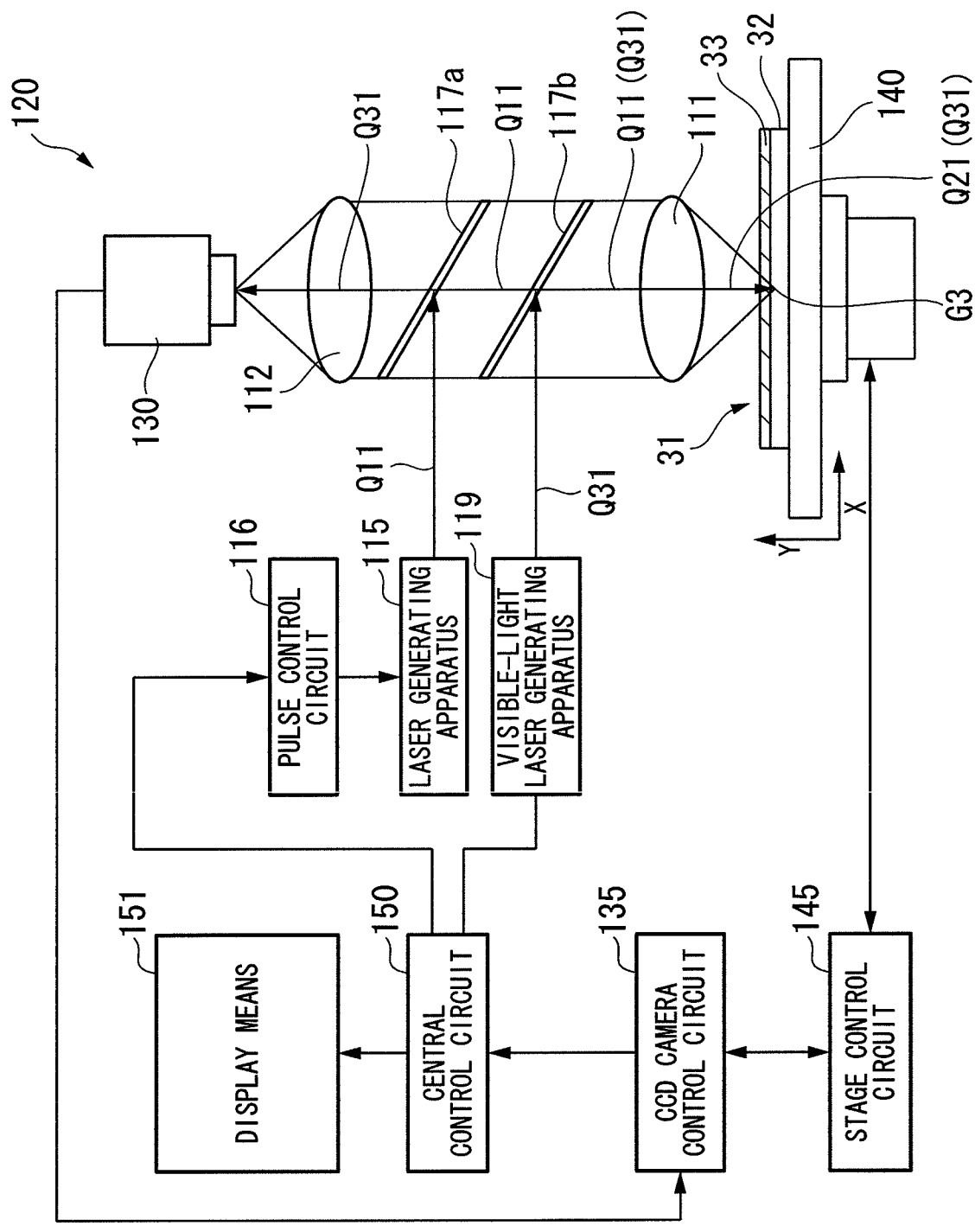
FIG. 15 is a schematic view illustrating an example of the laser irradiation apparatus used in forming the gettering sink.

FIG. 15 is a schematic view illustrating an example of the laser irradiation apparatus used in the step of forming the gettering sink in the semiconductor substrate. The laser irradiation apparatus 120 is the same as that used in the embodiment previously described, and thus a description thereof will be omitted. The proper laser irradiation conditions may be the same as shown in the above-mentioned Table 1.

The stage 140 is controlled in the vertical direction Y so that the laser beam Q11 generated by the laser generating apparatus 115 converges the width of the light path through a condensing lens 111, and the converged laser beam Q21 is focus-imaged (condensed) at an arbitrary depth position G3 of the semiconductor substrate 32. The condensing lens 111 preferably has, for example, a magnification of 10 to 300, an N.A of 0.3 to 0.9, and a transmittance with respect to the wavelength of the laser beam of 30 to 60%.

The visible-light laser beam Q31 generated by the visible-light laser generating apparatus 119 is reflected by the beam splitter (half mirror) 117b and turns around 90 degrees, and then reaches the epitaxial layer 33 of the semiconductor substrate 32. The visible-light laser beam is reflected from the surface of the epitaxial layer 33, and reaches the imaging lens 112 by being transmitted through the condensing lens 111 and the beam splitters 117a and 117b. The visible-light laser Q31 reaching the imaging lens 112 is imaged onto the CCD camera 130 as a surface image of the semiconductor substrate 32, and imaging data are input to the CCD camera control circuit 135. The stage control circuit 145 controls the amount of movement in the horizontal direction X of the stage 140 on the basis of the input imaging data.

Figure 16:
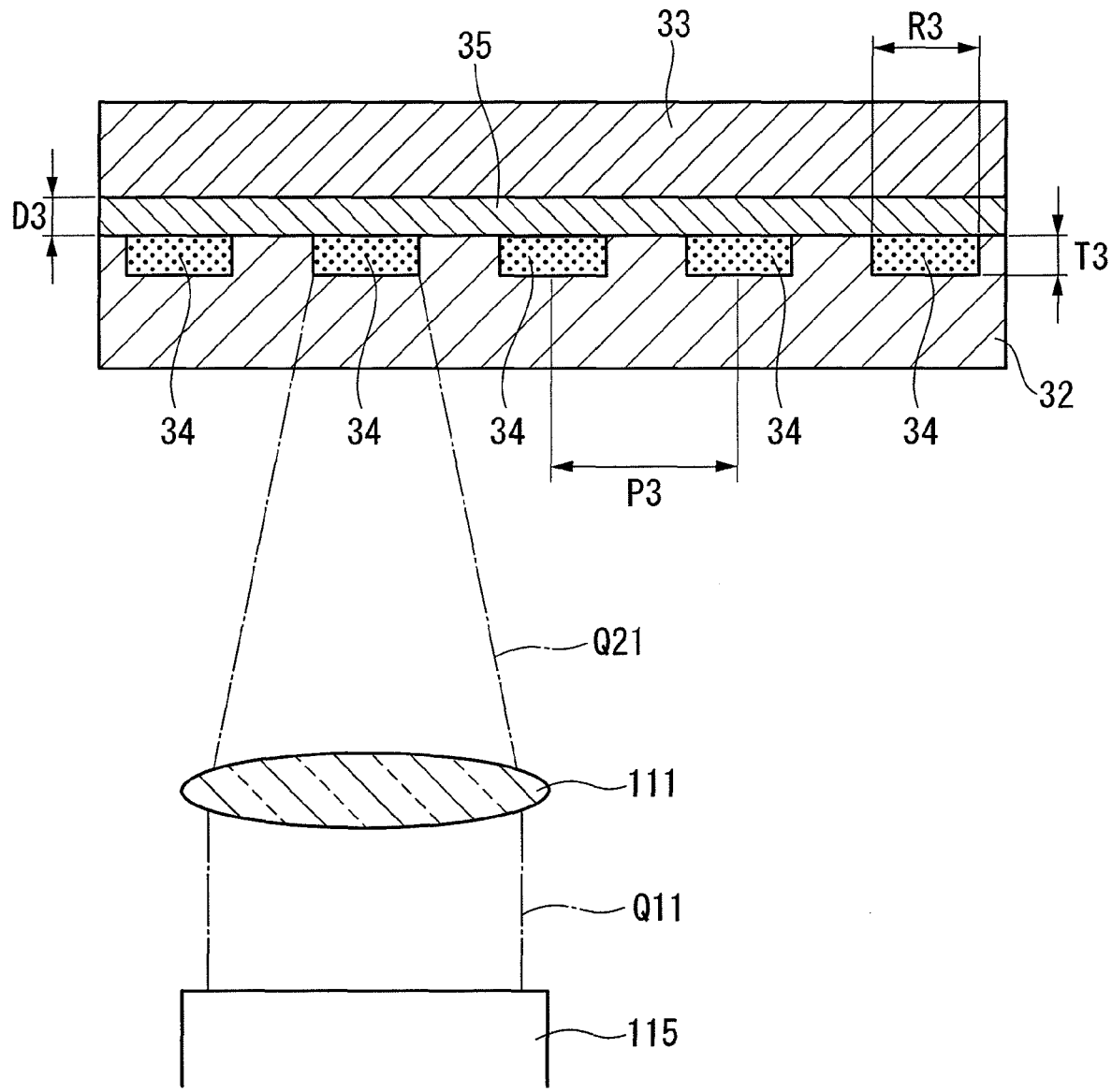
FIG. 16 is a cross-sectional view illustrating a state where the gettering sink is formed on a semiconductor substrate.

Next, a method of forming the gettering sink in the semiconductor substrate 32 in which the epitaxial layer 33 is formed will be described in detail. FIG. 16 is a schematic view illustrating a state where the gettering sink is formed in the semiconductor substrate by a laser beam. When the gettering sink is formed in the semiconductor substrate 32, the laser beam Q11 emitted from the laser generating apparatus 115 is converged by the condensing lens (condensing means) 111. The converged laser beam Q21 has a wavelength band capable of being transmitted through the silicon, and thus after the laser beam reaches the back surface of the semiconductor substrate 32, it is not reflected and is incident on the back surface as it is.

The semiconductor substrate 32 in which the epitaxial layer 33 is formed is positioned so that the condensing point (focal point) of the laser beam Q21 is set to a predetermined depth D3 from one surface 32*a* of the semiconductor substrate 32. Thereby, in the semiconductor substrate 32, a multiphoton absorption process occurs only in the condensing point (focal point) of the laser beam Q21.

In the invention, by condensing the laser beam in an arbitrary region inside the semiconductor substrate 32, the semiconductor substrate having a single crystal structure is modified at the condensing point (focal point), and a partially amorphous-like crystal structure is generated. The modifying of the crystal structure may be performed to an extent that the operation of capturing heavy metals is generated, that is, a little distortion is generated in the crystal structure.

As described above, the condensing point (focal point) of the laser beam Q21 on which the laser beam Q11 is converged is set at an arbitrary microscopic region inside the semiconductor substrate 32, and the crystal structure of the microscopic region is modified, to thereby allow the gettering sink 34 to be formed in the arbitrary microscopic region of the semiconductor substrate 32.

It is important that the laser beam for forming the gettering sink 34 does not modify the crystal structure of the epitaxial layer 33 or the semiconductor substrate 32 in the light path before the laser beam reaches the condensing point (focal point), and is set to conditions in which the laser beam is able to be reliably transmitted. The irradiation conditions of the laser beam to be used are determined based on a forbidden band (energy band gap) which is a basic physical property value of a semiconductor material. For example, since the forbidden band of the silicon semiconductor is 1.1 eV, the laser beam has a remarkable transmission property in the case where the incident wavelength is 1,000 nm or more. In this manner, the wavelength of the laser beam to be used can be determined based on the forbidden band of the semiconductor material.

As a laser beam generating apparatus, since there may be a concern that thermal energy is transferred to not only a predetermined depth position but also the peripheral region thereof by a high-power laser such as a YAG laser, it is preferable to use a low-energy laser. As a low-energy laser, for example, an ultra-short pulsed laser such as a femtosecond laser is preferably used.

In the ultra-short pulsed laser, the wavelength of the laser beam can be set to an arbitrary range by exciting a titanium-sapphire crystal (solid-state laser crystal) using a semiconductor laser and the like. In the ultra-short pulsed laser, the pulse width of an excited laser beam can be set to $1.0 \times 10^{-15}$ femtoseconds or less. Therefore, compared to other lasers, it is possible to suppress the diffusion of thermal energy generated by excitation, and to concentrate light energy only on the condensing point (focal point) of the laser beam.

The gettering sink 34 formed by modifying the crystal structure by the multi-photon absorption process is probably assumed to have an amorphous-like crystal structure. In order to obtain such an amorphous-like crystal structure, it is necessary to locally rapidly heat and rapidly cool the condensing point (focal point) G3 using the laser beam. The ultra-short pulsed laser having the characteristics as shown in Table 1 is a laser having a small amount of energy. However, the ultra-short pulsed laser is condensed using the condensing lens 111, whereby it has an energy sufficient to locally rapidly heat the semiconductor substrate 32. The temperature of the condensing point (focal point) G3 of the laser beam reaches a high temperature of 9,900 to 10,000 K. The heat input range is considerably narrow due to condensation of the laser beam. Therefore, when the stage in which the semiconductor substrate 32 is placed is moved, or the condensing point (focal point) is moved by scanning of the laser beam, the amount of heat input in the condensing point (focal point) before the movement is drastically reduced, and thus a rapid cooling effect is obtained.

By setting the wavelength thereof to 1,000 nm as in the ultra-short pulsed laser shown in Table 1, it is possible to enhance the transmission property for the epitaxial layer 33 or the semiconductor substrate 32, and to modify only the microscopic region which is a condensing point (focal point) of the laser beam without affecting a crystal structure such as the epitaxial layer 33. The modified portion of the crystal structure can be suitably used as the gettering sink 34 of the semiconductor substrate 32. When the wavelength of the laser beam exceeds 1,200 nm, photon energy (laser beam energy) decreases because of the long-wavelength region. For this reason, since there may be a concern that photon energy sufficient to modify the inside of the semiconductor substrate cannot be obtained even by condensing the laser beam, the wavelength of the laser beam is preferably set to 1,200 nm or less.

The position of the condensing point (focal point) G3 of the laser beam, that is, the position at which the gettering sink 34 is formed in the semiconductor substrate 32 can be controlled by the vertical movement of the stage. In addition to the vertical movement of the stage, the position of the condensing point (focal point) G3 of the laser beam can also be controlled by controlling the position of the condensing means (condensing lens).

As an example, when the gettering sink 34 is formed by modifying the portion located at a depth of 2 μm from the surface of the semiconductor substrate, the wavelength of the laser beam is set to 1,080 nm, and the laser beam is imaged (condensed) at the position located at a depth of 2 μm from the surface using a condensing lens (50-fold magnification) having a transmittance of 60%, thereby allowing the modified portion (gettering sink) to be formed by causing the multi-photon absorption process to occur.

In this manner, the gettering sink 34 obtained by modifying the crystal structure of the microscopic region of the semiconductor substrate 32 may be formed, for example, in the shape of a disk having a diameter R3 of 50 to 150 μm and a thickness T3 of 10 to 150 μm. The depth D3 at which the gettering sink 34 is formed is preferably 0.5 to 2 μm or so from one surface 32*a* of the semiconductor substrate 32.

Each of the gettering sinks 34 may be formed at least at the position that overlaps the back illuminated solid-state imaging device forming region S3 of the epitaxial substrate 31. The gettering sink 34 may be formed, for example, at intervals with a formation pitch P3 of 0.1 to 10 μm. The gettering sink 34 is not only intermittently formed as mentioned above, but may also be, for example, uniformly formed in the entire semiconductor substrate at a predetermined depth with respect to the semiconductor substrate.

The state where the gettering sink is formed in the epitaxial substrate is the same as that of FIG. 6 previously described. The gettering sinks 34 (14 in FIG. 6) may be respectively formed at the lower portion of the back illuminated solid-state imaging device forming region in the epitaxial substrate 31 (11 in FIG. 6). For example, when the laser beam Q1 is scanned along the X direction while sliding the epitaxial substrate 31 in the Y direction at the outer edge thereof so that the laser beam is scanned throughout the entirety of the epitaxial substrate 31, and irradiation with the laser beam Q1 is performed under the predetermined conditions, it is possible to form the gettering sinks 34, 34 . . . in the entire epitaxial substrate 31.

The formation density of the gettering sink 34 in the entire epitaxial substrate 31 can be set by the scanning pitch B1 of the laser beam Q1. The formation density of the gettering sink 34 is preferably set to, for example, a range of $1.0 \times 10^5$ to $1.0 \times 10^7$ counts/cm². The formation density of the gettering sink 34 can be verified by the number of oxygen precipitates obtained by the observation using a cross-sectional TEM (transmission electron microscope).

As described above, the gettering sink 34 is formed in the epitaxial substrate 31 by the steps described in detail (see FIG. 12(*d*)). Next, a large number of photodiodes 361 are formed in the epitaxial layer 33 using the epitaxial substrate 31 in which the gettering sink 34 is formed. The insulating layer 362 or the interconnection 363 is formed on one surface 33*a* side of the epitaxial layer 33 (see FIG. 13(*a*)). The surface of the insulating layer 362 is planarized.

Subsequently, the epitaxial substrate 31 in which the photodiode 361 or the interconnection 363 is formed is heated to a predetermined temperature by an annealing apparatus 380 (see FIG. 13(*b*)). Thereby, heavy metals diffused within the semiconductor substrate 32 are collected in the gettering sink 34, and the concentration of heavy metals of the element forming portion, that is, the region in which the photodiode 361 is formed can be set to be extremely low.

Next, a support substrate 390 is attached to one surface 362*a* side of the insulating layer 362 (see FIG. 13(*c*)). The attachment of the support substrate 390 is to prevent the epitaxial substrate 31 from being broken at the time of thinning in the subsequent step. As the support substrate 390, for example, a silicon wafer may be used.

Subsequently, the epitaxial substrate 31 to which the support substrate 390 is attached is ground from the other surface (back surface) 32*a* side of the semiconductor substrate 32, using a grinding device and the like. By grinding, for example, the entirety of the semiconductor substrate 32 and even a portion of the epitaxial layer 33 may be scraped away and thinned (see FIG. 14(*a*)).

As described above, the back illuminated solid-state imaging device 360 is completed through the step as mentioned above (see FIG. 14(*b*)). In the back illuminated solid-state imaging device 360, the incident light F3 is incident from the other surface (back surface) 33*b* side of the epitaxial layer 33, and is detected by the photodiode 361.

As described above, according to the method of manufacturing the back illuminated solid-state imaging device of the invention, it is possible to form, easily and in a short time, the gettering sink in which only the crystal structure of an arbitrary microscopic region inside the semiconductor substrate is changed, by causing the laser beam to be incident on the epitaxial substrate through the condensing means and condensing the laser beam in the microscopic region, to cause the multi-photon absorption process to occur in the microscopic region inside the semiconductor substrate.

Thereby, heat treatment for a long period of time is not required for forming the gettering sink as in the related art, and thus it is possible to simplify the step of manufacturing the back illuminated solid-state imaging device, and to reduce the manufacturing costs. It is possible to easily form the gettering sink in the inside of the semiconductor substrate even with respect to the substrate polished on both sides represented by a wafer having a diameter of 300 mm and the like.

Since heavy metals included in the epitaxial layer are reliably captured by the gettering sink formed in the semiconductor substrate of the epitaxial substrate used in the manufacture, it is possible to suppress a dark leakage current of the photodiode which is the cause of a decrease in the imaging characteristics of the back illuminated solid-state imaging device. Consequently, it is possible to realize the back illuminated solid-state imaging device having excellent imaging characteristics.

[Silicon Wafer]

Figure 17:
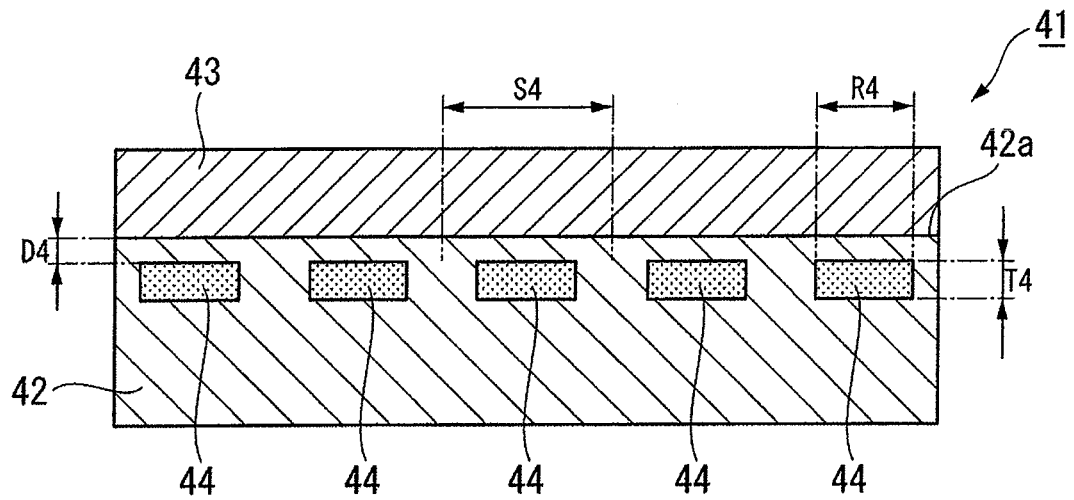
FIG. 17 is a cross-sectional view illustrating an epitaxial wafer according to an embodiment of the invention.

FIG. 17 is an enlarged cross-sectional view, for example, illustrating the epitaxial wafer suitable for manufacturing the solid-state imaging device. An epitaxial wafer 41 includes a silicon wafer 42 and an epitaxial layer 43 formed on one surface 42*a* of the silicon wafer 42. Gettering sinks 44, 44 . . . for capturing heavy metals of the epitaxial wafer 41 are formed in the vicinity of one surface 42*a* of the silicon wafer 42.

Such an epitaxial wafer 41 can be suitably used as a substrate for a solid-state imaging device. The silicon wafer 42 may be, for example, a silicon single crystal wafer. The epitaxial layer 43 may be an epitaxial growth film of silicon grown from one surface 42*a* of the silicon wafer 42.

The gettering sink 44 may have an amorphous-like structure in which a portion of a silicon single crystal is made amorphous. The gettering sink 44 has a capability to capture heavy metals just by the existence of a little distortion in the crystal structure thereof, and can play a role as a gettering sink just by making amorphous only a small fraction thereof. The gettering sink 44 is formed by causing a multi-photon absorption process to occur in a portion of the silicon wafer 42 to thereby modify a crystal structure, by condensation of a laser beam. Such a method of forming the gettering sink 44 will be described later in detail in a method of manufacturing an epitaxial wafer.

When the solid-state imaging device is formed, for example, using the epitaxial wafer 41, the gettering sinks 44 may be formed at positions that overlap at least each of the solid-state imaging device forming regions S4. For example, one gettering sink 44 may be formed in the shape of a disk having a diameter R4 of 50 to 150 μm, more preferably 75 to 125 μm, and a thickness T4 of 10 to 150 μm, more preferably 10 to 100 μm. The depth D4 at which the gettering sink 44 is formed is preferably 0.5 to 2 μm or so from one surface 42*a* of the silicon wafer 42. The depth D4 is more preferably 0.8 to 1.5 μm.

Figure 18:
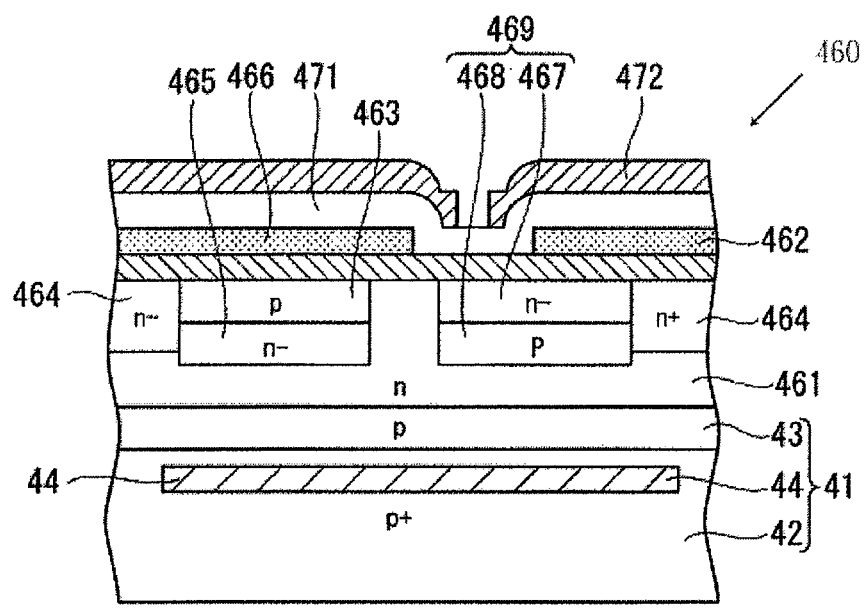
FIG. 18 is a cross-sectional view illustrating an example of the solid-state imaging device in which the wafer is used.

FIG. 18 is a cross-sectional view illustrating an example of the solid-state imaging device created using the epitaxial wafer obtained by the method of manufacturing the epitaxial wafer according to the invention.

In a solid-state imaging device 460, the epitaxial wafer 41 is used in which the p-type epitaxial layer 43 is formed on the p⁺-type silicon wafer (silicon substrate) 42 and the gettering sink 44 is further formed in the silicon wafer 42. A first n-type well region 461 is formed at a predetermined position of the epitaxial layer 43. A p-type transfer channel region 463, an n⁺-type channel stop region 464 and a second n⁻-type well region 465 included in a vertical transfer register are respectively formed in the inside of the first n-type well region 461.

Further, a transfer electrode 466 is formed at a predetermined position of a gate insulating film 462. A photodiode 469 in which an n⁻-type positive charge accumulation region 467 and a p-type impurity diffusion region 468 are laminated is formed between the p-type transfer channel region 463, the second n-type well region 465, the n-type channel stop region 464. The solid-state imaging device includes an interlayer insulating film 471 that covers the gate insulating film 462 and the photodiode 469, and a light shielding film 472 that covers the surface except for the upper portion directly located on the photodiode 469.

In the solid-state imaging device 460 having such a configuration, since heavy metals included in the epitaxial wafer 41 are reliably captured by the gettering sink 44 formed in the silicon wafer 42, it is possible to suppress a dark leakage current of the photodiode 469 which is the cause of a decrease in the imaging characteristics of the solid-state imaging device 460. Consequently, it is possible to realize a solid-state imaging device 460 having a small amount of a dark leakage current and excellent imaging characteristics, by forming the solid-state imaging device 460 using the epitaxial wafer 41 obtained by the manufacturing method according to the invention.

Figure 19:
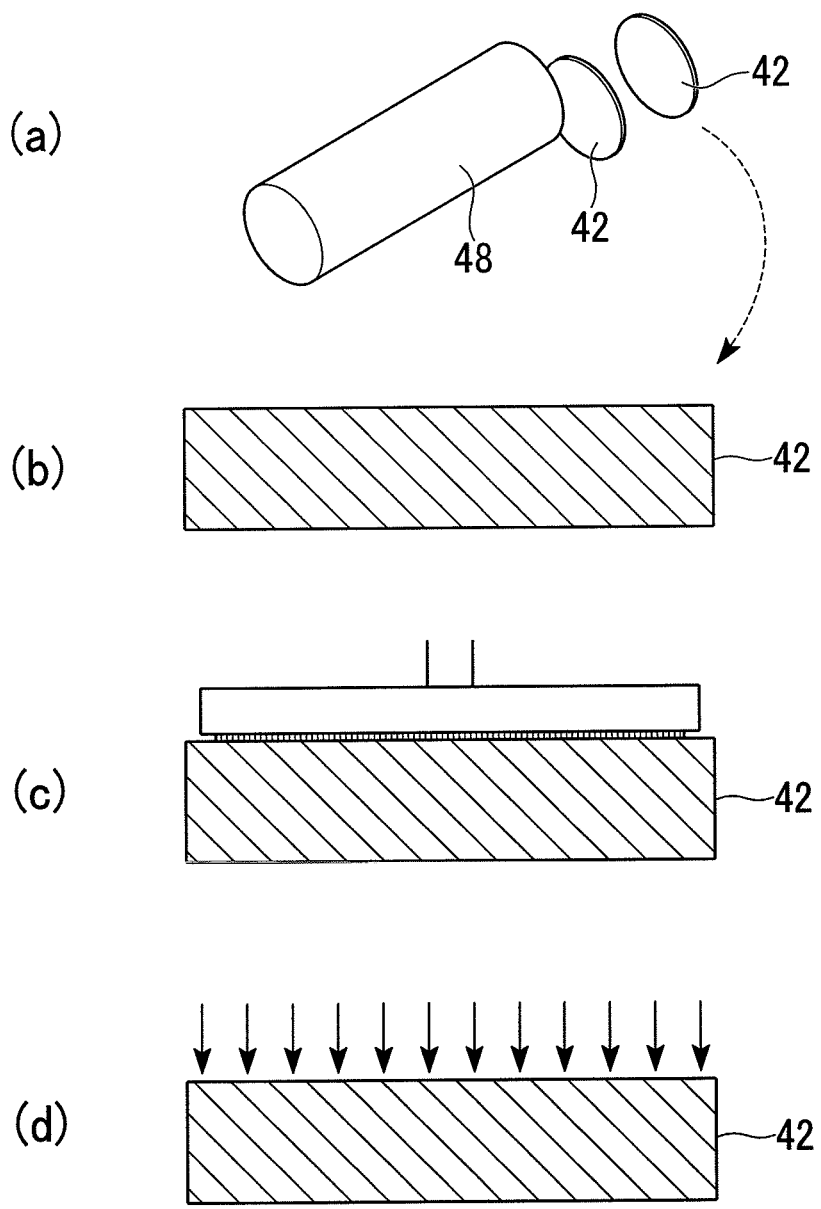
FIG. 19 is a cross-sectional view illustrating a method of manufacturing a silicon wafer and a method of manufacturing the epitaxial wafer according to an embodiment of the invention.
Figure 20:
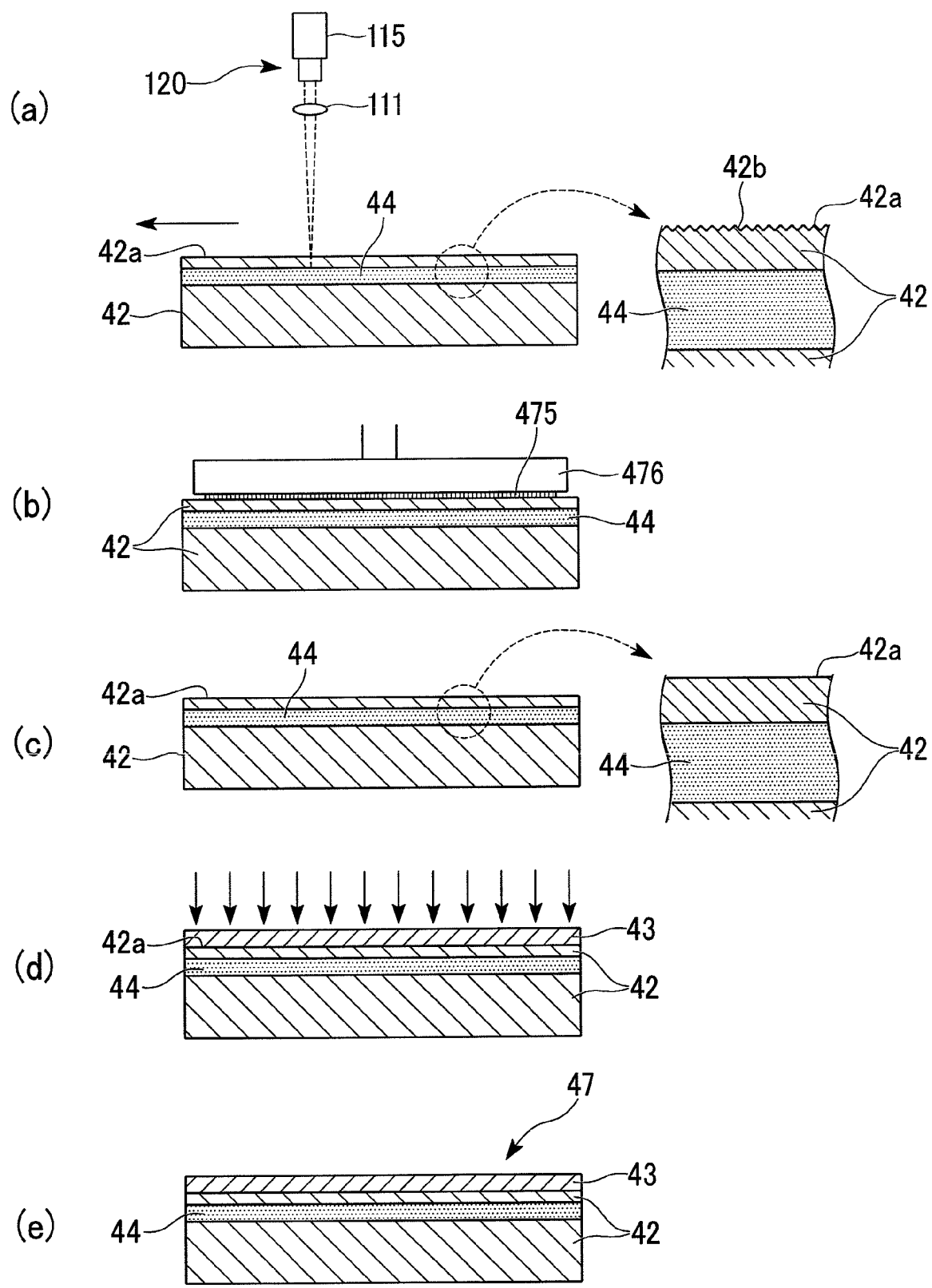
FIG. 20 is a cross-sectional view illustrating the method of manufacturing the silicon wafer and the method of manufacturing the epitaxial wafer according to an embodiment of the invention.

Next, a method of manufacturing a silicon wafer according to the invention, and a method of manufacturing an epitaxial wafer using such a silicon wafer will be described. FIGS. 19 and 20 are cross-sectional views illustrating a method of manufacturing the silicon wafer and a method of manufacturing the epitaxial wafer in a step-by-step manner. First, in manufacturing the silicon wafer, a silicon single crystal ingot 48 grown, for example, by a Czochralski method (CZ method) is sliced (slicing step: see FIG. 19(a)), and a silicon wafer (slice wafer) 42 is obtained (see FIG. 19(b)).

Next, the surface of the silicon wafer 42 is lapped using abrasive grains and the like (lapping step: see FIG. 19(c)). Next, the lapped silicon wafer (lapped wafer) 42 is etched, and the crystal distortion of the silicon wafer generated in the slicing step or the lapping step and the like is removed (etching step: see FIG. 19(d)). In the etching step, for example, a mixture of hydrofluoric acid, nitric acid and acetic acid, or an alkali solution such as sodium hydroxide may be used as an etchant.

The lapping step or the etching step may be performed, and is not necessarily an essential step. Before the lapping step, a grinding step of grinding the surface of the silicon wafer 42 using a grinding machine may be further included.

Next, the silicon wafer 42 is set in a laser irradiation apparatus 120, and one surface 42a is irradiated with a laser beam while the silicon wafer 42 is moved (multi-photon absorbing step: see FIG. 20(a)). In the multi-photon absorbing step, the laser beam emitted from the laser generating apparatus 115 is condensed by the condensing lens (condensing means) 111 so that the condensing point (focal point) is positioned at a depth of several tens of μm or so from one surface 42a of the silicon wafer 42. Thereby, the crystal structure of the silicon wafer 42 is modified, and the gettering sink 44 is formed.

Figure 21:
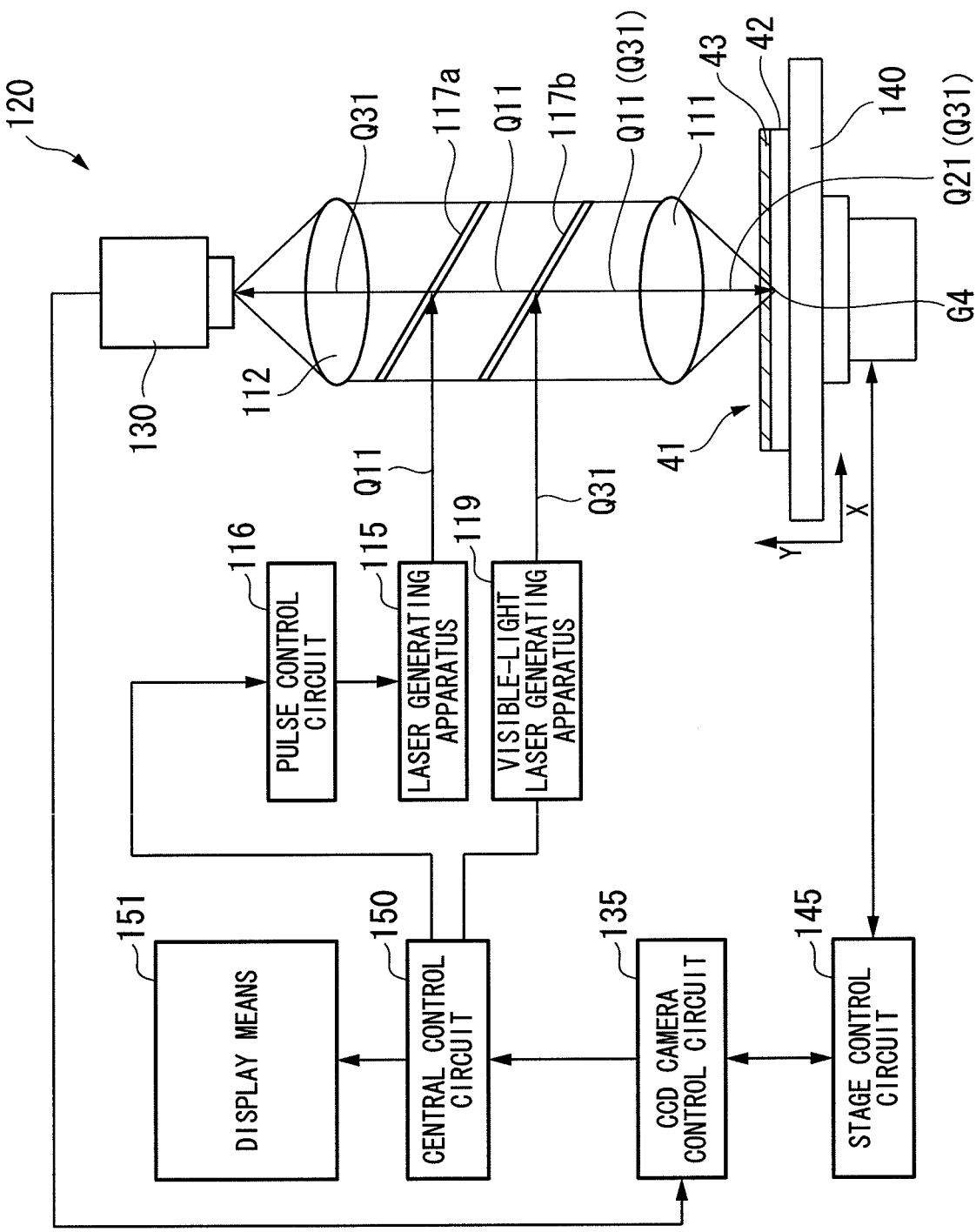
FIG. 21 is a schematic view illustrating an example of the laser irradiation apparatus used in forming the gettering sink.

FIG. 21 is a schematic view illustrating an example of the laser irradiation apparatus 120 for forming the gettering sink in the silicon wafer. This may be the same as that used in the embodiment previously described. The proper laser irradiation conditions may be the same as shown in the above-mentioned Table 1.

The stage 140 is controlled in the vertical direction Y so that the laser beam Q11 generated by the laser generating apparatus 115 converges the width of the light path through a condensing lens 111, and the converged laser beam Q21 is focus-imaged (condensed) at an arbitrary depth position G4 of the silicon wafer 42. The condensing lens 111 preferably has, for example, a magnification of 10 to 300, an N.A of 0.3 to 0.9, and a transmittance with respect to the wavelength of the laser beam of 30 to 60%.

The visible-light laser beam Q31 generated by the visible-light laser generating apparatus 119 is reflected by the beam splitter (half mirror) 117b and turns around 90 degrees, and then reaches the epitaxial layer 43 of the silicon wafer 42. The visible-light laser beam is reflected from the surface of the epitaxial layer 43, and reaches the imaging lens 112 by being transmitted through the condensing lens 111 and the beam splitters 117a and 117b. The visible-light laser Q31 reaching the imaging lens 112 is imaged onto the CCD camera 130 as a surface image of the silicon wafer 42, and imaging data are input to the CCD camera control circuit 135. The stage control circuit 145 controls the amount of movement in the horizontal direction X of the stage 140 on the basis of the input imaging data.

Figure 22:
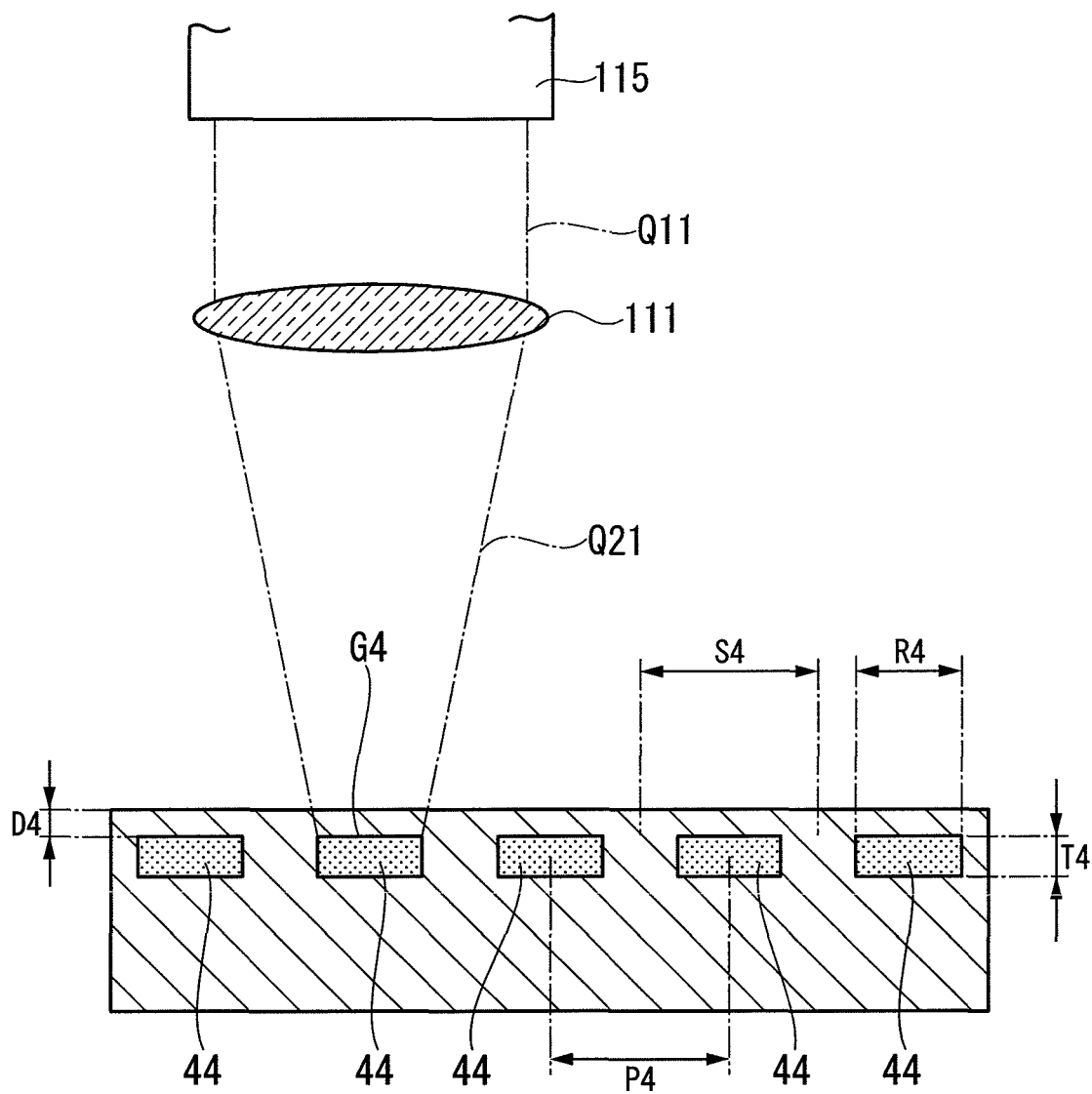
FIG. 22 is a cross-sectional view illustrating a state where the gettering sink is formed in the silicon wafer.

Next, a method of forming the gettering sink in the silicon wafer 42 will be described in detail. FIG. 22 is a schematic view illustrating a state where the gettering sink is formed in the silicon wafer using a laser beam. When the gettering sink is formed in the silicon wafer 42, the laser beam Q11 emitted from the laser generating apparatus 115 is converged by the condensing lens (condensing means) 111. The converged laser beam Q21 has a wavelength band capable of being transmitted through the silicon, and thus after the laser beam reaches the surface of the epitaxial layer 43, it is not reflected and is incident on the back surface as it is.

The silicon wafer 42 is positioned so that the condensing point (focal point) of the laser beam Q21 is set to a predetermined depth D4 from one surface 42a of the silicon wafer 42. Thereby, only at the condensing point (focal point) of the laser beam Q21, a multi-photon absorption process occurs in the silicon wafer 42.

In the invention, by condensing the laser beam in an arbitrary region inside the silicon wafer 42, the silicon wafer having a single crystal structure is modified at the condensing point (focal point), and a partially amorphous-like crystal structure is generated. The modifying of the crystal structure may be performed to an extent that the operation of capturing heavy metals is generated, that is, a little distortion is generated in the crystal structure.

As described above, the condensing point (focal point) of the laser beam Q21 on which the laser beam Q11 is converged is set at an arbitrary microscopic region inside the silicon wafer 42, and the crystal structure of the microscopic region is modified, to thereby allow the gettering sink 44 to be formed in the arbitrary microscopic region of the silicon wafer 42.

It is important that the laser beam for forming the gettering sink 44 does not modify the crystal structure of the silicon wafer 42 in the light path before the laser beam reaches the condensing point (focal point), and is set to conditions in which the laser beam is able to be reliably transmitted. The irradiation conditions of the laser beam to be used are determined based on a forbidden band (energy band gap) which is a basic physical property value of a semiconductor material. For example, since the forbidden band of the silicon semiconductor is 1.1 eV, the laser beam has a remarkable transmission property in the case where the incident wavelength is 1,000 nm or more. In this manner, the wavelength of the laser beam to be used can be determined based on the forbidden band of the semiconductor material.

As a laser beam generating apparatus, since there may be a concern that thermal energy is transferred to not only a predetermined depth position but also the peripheral region thereof by a high-power laser such as a YAG laser, it is preferable to use a low-energy laser. As a low-energy laser, for example, an ultra-short pulsed laser such as a femtosecond laser is preferably used.

In the ultra-short pulsed laser, the wavelength of the laser beam can be set to an arbitrary range by exciting a titanium-sapphire crystal (solid-state laser crystal) using a semiconductor laser and the like. In the ultra-short pulsed laser, the pulse width of an excited laser beam can be set to $1.0\times10^{-15}$ femtoseconds or less. Therefore, compared to other lasers, it is possible to suppress the diffusion of thermal energy generated by excitation, and to concentrate light energy only on the condensing point (focal point) of the laser beam.

The gettering sink 44 formed by modifying the crystal structure by the multi-photon absorption process is probably assumed to have an amorphous-like crystal structure. In order to obtain such an amorphous-like crystal structure, it is necessary to locally rapidly heat and rapidly cool the condensing point (focal point) G4 using the laser beam. The ultra-short pulsed laser having the characteristics, for example, as shown in Table 2 described later is a laser having a small amount of energy. However, the ultra-short pulsed laser is condensed using the condensing lens 111, whereby it has an energy sufficient to locally rapidly heat the silicon wafer 42. The temperature of the condensing point (focal point) G4 of the laser beam reaches a high temperature of 9,900 to 10,000 K. The heat input range is considerably narrow due to condensation of the laser beam. Therefore, when the stage in which the silicon wafer 42 is placed is moved, or the condensing point (focal point) is moved by scanning of the laser beam, the amount of heat input in the condensing point (focal point) before the movement is drastically reduced, and thus a rapid cooling effect is obtained.

By setting the wavelength thereof to 1,000 nm as in the ultra-short pulsed laser shown in Table 1, it is possible to enhance the transmission property for the silicon wafer 42, and to modify only the microscopic region which is a condensing point (focal point) of the laser beam. The modified portion of the crystal structure can be suitably used as the gettering sink 44 of the silicon wafer 42. When the wavelength of the laser beam exceeds 1,200 nm, photon energy (laser beam energy) decreases because of the long-wavelength region.

For this reason, since there may be a concern that photon energy sufficient to modify the inside of the silicon wafer cannot be obtained even by condensing the laser beam, the wavelength of the laser beam is preferably set to 1,200 nm or less.

The position of the condensing point (focal point) G4 of the laser beam, that is, the position at which the gettering sink 44 is formed in the silicon wafer 42 can be controlled by vertical movement of the stage. In addition to the vertical movement of the stage, the position of the condensing point (focal point) G4 of the laser beam can also be controlled by controlling the position of the condensing means (condensing lens).

As an example, when the gettering sink 44 is formed by modifying the portion located at a depth of 2 µm from the surface of the silicon wafer 42, the wavelength of the laser beam is set to 1,080 nm, and the laser beam is imaged (condensed) at the position located at a depth of 2 µm from the surface using a condensing lens (50-fold magnification) having a transmittance of 60%, thereby allowing the modified portion (gettering sink) to be formed by causing the multi-photon absorption process to occur.

In this manner, the gettering sink 44 obtained by modifying the crystal structure of the microscopic region of the silicon wafer 42 may be formed, for example, in the shape of a disk having a diameter R4 of 50 to 150 µm and a thickness T4 of 10 to 150 µm. The depth D4 at which the gettering sink 44 is formed is preferably 0.5 to 2 µm or so from one surface 42a of the silicon wafer 42.

Each of the gettering sinks 44 may be formed at least at the position that overlaps the semiconductor device formed in the subsequent step, for example, the solid-state imaging device forming region S4. The gettering sink 44 may be formed, for example, at intervals with a formation pitch P4 of 0.1 to 10 µm. The gettering sink 44 is not only intermittently formed as mentioned above, but also may be, for example, uniformly formed over the whole surface of the silicon wafer 42 at a predetermined depth with respect to the silicon wafer 42.

The state where the gettering sink is formed in the silicon wafer is the same as that of FIG. 6 previously described. The gettering sinks 44 (14 in FIG. 6) may be respectively formed at the lower portion of the semiconductor device in the silicon wafer 42, for example, the solid-state imaging device forming region. For example, when the laser beam Q1 is scanned along the X direction while sliding the silicon wafer 42 in the Y direction at the outer edge thereof so that the laser beam is scanned throughout the entirety of the silicon wafer 42 (11 in FIG. 6), and irradiation with the laser beam Q1 is performed under the predetermined conditions, it is possible to form the gettering sinks 44, 44 . . . in the entire silicon wafer 42.

The formation density of the gettering sink 44 in the entire silicon wafer 42 can be set by the scanning pitch B1 of the laser beam Q1. The formation density of the gettering sink 44 is preferably set to, for example, a range of $1.0\times10^5$ to $1.0\times10^7$ counts/cm$^2$. The formation density of the gettering sink 44 can be verified by the number of oxygen precipitates obtained by the observation using a cross-sectional TEM (transmission electron microscope).

As mentioned above, when the silicon wafer 42 is irradiated with the laser beam through the multi-photon absorbing step described in detail, one surface 42a of the silicon wafer 42 is such that a portion of silicon atoms on the surface layer is evaporated by the laser beam, and that minute flaws (ablation) 42b occur in the surface thereof (see the right drawing of FIG. 20(a)). The surface roughness of one surface 42a of the silicon wafer 42 is set to, for example, 1.0 to 2.5 nm by laser beam irradiation in the multi-photon absorbing step.

Next, after the gettering sinks 44, 44 . . . are formed through the multi-photon absorbing step, the silicon wafer 42 is mirror-polished (polishing step: see FIG. 20(b)). In the polishing step, for example, using a polishing processing machine having a platen 476 to which a polishing pad 475 is attached, the above step is divided into one or a plurality of steps, and the surface of the silicon wafer 42 is mirror-polished. In the polishing step, the single side or both sides thereof may be mirror-polished in accordance with the specifications of the wafer.

Through the polishing step of mirror-polishing the silicon wafer 42, the minute flaws (ablation) on one surface 42a of the silicon wafer 42 caused by laser beam irradiation in the multi-photon absorbing step which is a previous step are completely removed (see the right drawing of FIG. 20(c)). It is possible to obtain the silicon wafer 42 having no ablation, for example, as with a surface roughness of 0.1 to 0.25 nm (see FIG. 20(c)).

As described above, in the method of manufacturing the silicon wafer according to the invention, laser light irradiation is performed to form the gettering sinks 44, 44 . . . in the multi-photon absorbing step, and then the silicon wafer 42 is mirror-polished (polishing step), thereby allowing the minute flaws (ablation) on the surface of the silicon wafer 42 caused by laser light irradiation to be completely removed. Thereby, it is possible to obtain a silicon wafer which has no minute flaws caused by laser irradiation on the surface thereof, and includes therein the gettering sink formed through the multi-photon absorbing step.

Next, in the method of manufacturing the epitaxial wafer according to the invention, the epitaxial layer 43 is formed on one surface 42a of the silicon wafer 42 obtained through the steps as mentioned above (see FIG. 20(d)). In forming the epitaxial layer 43 using, for example, an epitaxial growth system, a raw material gas may be introduced while the silicon wafer 42 is heated to a predetermined temperature, and the epitaxial layer 43 made of a silicon single crystal may be grown on one surface 42a.

After that, the epitaxial wafer 41 in which the epitaxial layer 43 and the gettering sink 44 are formed may be heated to a predetermined temperature, for example, using an annealing apparatus (annealing step). Thereby, heavy metals diffused within the silicon wafer 42 are collected in the gettering sink 44, and the epitaxial wafer 41 having an extremely small amount of heavy metals in the element forming portion is obtained.

When a semiconductor element, for example, a buried-type photodiode is formed using such an epitaxial wafer 41 (element forming step), it is possible to obtain the solid-state imaging device having excellent characteristics in which the dark leakage current is suppressed.

EXAMPLE

As Example of the invention, the silicon wafer of which the substrate is 300 mm in diameter and 0.725 mm in thickness was irradiated with the laser beam under the conditions shown in Table 2, and the silicon wafer was created in which the modified portion (gettering sink) having a density of $10^{-6}/cm^2$ was formed at the position located at a depth of 2 μm from the surface of the silicon wafer.

TABLE 2

| | Irradiation conditions |
|---|---|
| Beam wavelength | 1,080 nm |
| Beam diameter | 1.0 μm |
| Repetition frequency | 1 MHz |
| Pulse width | $1.0 \times 10^{-9}$ sec |
| Output power | 100 mJ/pulse |

In order to confirm a gettering effect of the modified portion in the above-mentioned Example, a silicon wafer, which is formed in the same as the silicon wafer in the Example mentioned above except that laser beam irradiation was not performed, was prepared as conventional Comparative Example 1.

In order to make a comparison with the gettering effect of the silicon wafer in which the oxygen precipitation portion is formed through the heat treatment for a long period of time, a silicon wafer, which is formed in the same as the silicon wafer in Comparative Example 1 mentioned above except that the heat treatment was performed for ten hours or for twenty hours, was prepared as conventional Comparative Example 2.

The gettering effects were evaluated by the following method with respect to each of the samples of Example, Comparative Example 1 and Comparative Example 2.

First, after each of the samples was cleaned using a mixed solution of ammonia water and hydrogen peroxide water and a mixed solution of hydrochloric acid and hydrogen peroxide water, the surface thereof was contaminated with nickel which is a heavy metal to an extent of $1.0 \times 10^{12}$ atoms/cm$^2$ through a spin coat contamination method. Next, in a vertical heat-treating furnace, diffusion heat treatment was performed at a temperature of 1,000° C., for an hour, in a nitrogen atmosphere, and then the surface of each of the samples was etched using Wright solution (48% HF: 30 ml, 69% HNO$_3$: 30 ml, CrO$_3$ 1 g+H$_2$O 2 ml, acetic acid: 60 ml). The gettering capability of each of the samples was evaluated by observing the number of etch pits (pits in which nickel silicide is etched and formed) in the surface through an optical microscope and by measuring the etch pit density (counts/cm$^2$).

Measurement limitation of the etch pit density in this method was $1.0 \times 10^3$ counts/cm$^2$. The gettering capability was evaluated to be good when the etch pit density was $1.0 \times 10^3$ counts/cm$^2$ or less (the measurement limitation or less), possible when it was more than $1.0 \times 10^3$ counts/cm$^2$ and less than $1.0 \times 10^5$ counts/cm$^2$, and impossible when it was $1.0 \times 10^5$ counts/cm$^2$ or more.

For Comparative Example 2, the time required to form the oxygen precipitation portion used as the gettering sink was evaluated as follows. After each of the samples was cleaved in the (110) direction and was etched with Wright solution, the evaluation was performed by observing the cleaved plane (sample cross-section) using an optical microscope to measure the density (count/cm$^2$) of the oxygen precipitates. In the evaluation of the gettering capability, similarly to the above-mentioned Example 1, the evaluation of the gettering capability due to surface contamination in a nickel element was carried out.

As a verification result, in Comparative Example 1, the density of the etch pit was $1.0 \times 10^5$ counts/cm$^2$, and the gettering effect was not observed.

In Comparative Example 2, with respect to the sample in which heat treatment for ten hours was performed, the density of the oxygen precipitates was $1.0 \times 10^4$ counts/cm$^2$, and the density of the etch pit was $1.0 \times 10^5$ counts/cm$^2$, and thus the gettering effect was barely observed. Even in the sample in which heat treatment for twenty hours was performed, the density of the oxygen precipitates was $1.0 \times 10^5$ counts/cm$^2$, and the density of the etch pit was $1.0 \times 10^4$ counts/cm$^2$, and thus the gettering effect was somewhat observed.

On the other hand, in Example of the invention, the density of the etch pit was $1.0 \times 10^3$ counts/cm$^2$ or less, and thus the sufficient gettering effect was observed.

INDUSTRIAL APPLICABILITY

According to the invention, it is possible to easily form the gettering sink having excellent gettering capability at an arbitrary position, by performing laser beam irradiation for a short period of time to cause a multi-photon absorption process to occur only in a predetermined depth position of the semiconductor substrate and modifying the crystal structure thereof.

REFERENCE SIGNS LIST

11: EPITAXIAL SUBSTRATE FOR A SOLID-STATE IMAGING DEVICE, 12: SEMICONDUCTOR SUBSTRATE, 13: EPITAXIAL LAYER, 14: GETTERING SINK, 21: SEMICONDUCTOR DEVICE, 22: SEMICONDUCTOR SUBSTRATE, 23: FIRST INSULATING FILM (INSULATING FILM), 24: GETTERING SINK, 31: EPITAXIAL SUBSTRATE FOR A SOLID-STATE IMAGING DEVICE, 32: SEMICONDUCTOR SUBSTRATE, 33: EPITAXIAL LAYER, 34: GETTERING SINK, 360: BACK ILLUMINATED SOLID-STATE IMAGING DEVICE, 41: EPITAXIAL WAFER, 42: SILICON WAFER, 43: EPITAXIAL LAYER, 44: GETTERING SINK

The invention claimed is:

1. A method of manufacturing a silicon wafer, comprising:
    a slicing step of slicing a silicon single crystal ingot to obtain a silicon wafer;
    a multi-photon absorbing step of forming a gettering sink in which a crystal structure of an arbitrary microscopic region is changed, by causing a laser beam to be incident on one surface of the silicon wafer through a condensing lens and condensing the laser beam in the microscopic region, to cause a multi-photon absorption process to occur in the microscopic region in the silicon wafer;

a polishing step of mirror-polishing the one surface of the silicon wafer after the multi-photon absorbing step so as to remove minute flaws on the one surface of the silicon wafer, and an epitaxial growing step of growing an epitaxial layer made of a silicon single crystal on the one surface of the silicon wafer after the polishing step;

wherein the laser beam is an ultra-short pulsed-laser beam having a pulse width in a range of $1.0 \times 10^{-15}$ to $1.0 \times 10^{-8}$ seconds, a wavelength in a range of 300 to 1,200 nm, and an output power per pulse in a range of 1 to 1000 mJ, and the condensing lens condenses the laser beam to an arbitrary position in the thickness direction of the silicon wafer, wherein in the multi-photon absorbing step, a temperature of a condensing point of the laser beam reaches 9,900 to 10,000 K; and wherein in the multi-photon absorbing step, a portion of silicon atoms on the one surface of the silicon wafer is evaporated by the laser beam and the minute flaws occur in the one surface of the silicon wafer, while the silicon wafer is irradiated with the laser beam.

2. The method of manufacturing a silicon wafer according to claim 1, further comprising a lapping step of lapping the silicon wafer between the slicing step and the multi-photon absorbing step.

3. The method of manufacturing a silicon wafer according to claim 1, further comprising an etching step of etching the silicon wafer between the slicing step and the multi-photon absorbing step.

4. The method of manufacturing a silicon wafer according to claim 1, wherein the gettering sink includes silicon having an amorphous structure.

5. A method of manufacturing a solid-state imaging device, surface of the epitaxial wafer obtained by the method of manufacturing an epitaxial wafer according to claim 1.

6. The method of manufacturing a solid-state imaging device according to claim 5, further comprising an annealing step of annealing the epitaxial wafer at a predetermined temperature to capture heavy metals in the gettering sink.

7. The method of manufacturing a solid-state imaging device according to claim 5, wherein the gettering sink is formed at a region that overlaps at least a position for forming the buried-type photodiode, with a size in a range of a diameter of 50 to 150 μm and a thickness of 10 to 150 μm.

8. The method of manufacturing a solid-state imaging device according to claim 5, wherein the gettering sink is formed so as to have a density in a range of $1.0 \times 10^5$ to $1.0 \times 10^7$ counts /cm$^2$.

9. The method of manufacturing a silicon wafer according to claim 1, wherein the surface roughness of the minute flaws generated on the one surface of the silicon wafer is set to 1.0 to 2.5 nm by laser beam irradiation in the multi-photon absorbing step.

10. The method of manufacturing a silicon wafer according to claim 9, wherein the surface roughness of the one surface of the silicon wafer after the polishing step is set to 0.1 to 0.25 nm.

11. The method of manufacturing a silicon wafer according to claim 1, wherein the surface roughness of the one surface of the silicon wafer after the polishing step is set to 0.1 to 0.25 nm.

12. The method of manufacturing a silicon wafer according to claim 1, wherein the gettering sink is formed in a portion of 0.5 to 2 μm below one surface of the silicon wafer.

* * * * *